(12) United States Patent
Padmanabhan et al.

(10) Patent No.: US 9,818,674 B2
(45) Date of Patent: Nov. 14, 2017

(54) SEMICONDUCTOR COMPONENT AND METHOD OF MANUFACTURE

(71) Applicant: Semiconductor Components Industries, LLC, Phoenix, AZ (US)

(72) Inventors: Balaji Padmanabhan, Tempe, AZ (US); Ali Salih, Mesa, AZ (US); Prasad Venkatraman, Gilbert, AZ (US); Chun-Li Liu, Scottsdale, AZ (US)

(73) Assignee: SEMICONDUCTOR COMPONENTS INDUSTRIES, LLC, Phoeniz, AZ (US)

( * ) Notice: Subject to any disclaimer, the term of this patent is extended or adjusted under 35 U.S.C. 154(b) by 0 days.

(21) Appl. No.: 15/205,693

(22) Filed: Jul. 8, 2016

(65) Prior Publication Data

US 2017/0025327 A1   Jan. 26, 2017

Related U.S. Application Data

(60) Provisional application No. 62/196,646, filed on Jul. 24, 2015.

(51) Int. Cl.
  *H01L 23/495* (2006.01)
  *H01L 23/00* (2006.01)

(52) U.S. Cl.
  CPC .... *H01L 23/4951* (2013.01); *H01L 23/49524* (2013.01); *H01L 23/49531* (2013.01); *H01L 23/49544* (2013.01); *H01L 23/49562* (2013.01); *H01L 24/09* (2013.01); *H01L 24/89* (2013.01); *H01L 2224/0916* (2013.01); *H01L 2224/09181* (2013.01); *H01L 2224/80001* (2013.01)

(58) Field of Classification Search
  CPC ..... H01L 23/4951; H01L 24/09; H01L 24/89; H01L 23/49524; H01L 23/49531; H01L 23/49544; H01L 2224/0916; H01L 2224/09181; H01L 2224/80001
  See application file for complete search history.

(56) References Cited

U.S. PATENT DOCUMENTS

| 7,745,913 B2 | 6/2010 | Hosseini et al. |
| 8,455,987 B1 | 6/2013 | Spann et al. |
| 2007/0249092 A1 | 10/2007 | Joshi et al. |
| 2008/0164590 A1 | 7/2008 | Xiaochun et al. |
| 2010/0232131 A1 | 9/2010 | Qian et al. |
| 2011/0133251 A1 | 6/2011 | He |
| 2012/0223321 A1 | 9/2012 | Lin et al. |
| 2012/0223322 A1 | 9/2012 | Lin et al. |

(Continued)

*Primary Examiner* — Elias M Ullah
(74) *Attorney, Agent, or Firm* — Rennie William Dover

(57) ABSTRACT

In accordance with an embodiment, a semiconductor component includes a support having first and second device receiving structures. A semiconductor device configured from a III-N semiconductor material is coupled to the support, wherein the semiconductor device has opposing surfaces. A first bond pad extends from a first portion of the first surface, a second bond pad extends from a second portion of the first surface, and a third bond pad extends from a third portion of the first surface. The first bond pad is coupled to the first device receiving portion, the drain bond pad is coupled to the second device receiving portion, and the third bond pad is coupled to the third lead. In accordance with another embodiment, a method includes coupling a semiconductor chip comprising a III-N semiconductor substrate material to a support.

17 Claims, 12 Drawing Sheets

(56) References Cited

U.S. PATENT DOCUMENTS

| | | |
|---|---|---|
| 2013/0069208 A1 | 3/2013 | Briere |
| 2013/0088280 A1 | 3/2013 | Lal et al. |
| 2013/0175704 A1 | 7/2013 | Jeun |
| 2013/0256856 A1 | 10/2013 | Mahler et al. |
| 2014/0103510 A1 | 4/2014 | Andou |
| 2014/0197525 A1 | 7/2014 | Kadoguchi |
| 2014/0239472 A1 | 8/2014 | Jones et al. |
| 2014/0361419 A1 | 12/2014 | Xue et al. |
| 2015/0145112 A1 | 5/2015 | Otremba |
| 2016/0211246 A1 | 7/2016 | Akiyama et al. |
| 2016/0247792 A1 | 8/2016 | Chang |

SEMICONDUCTOR COMPONENT AND METHOD OF MANUFACTURE

The present application is a nonprovisional application of Provisional Patent Application No. 62/196,646 filed on Jul. 24, 2015, by Balaji Padmanabhan et al., titled "SEMICONDUCTOR COMPONENT AND METHOD OF MANUFACTURE", which is hereby incorporated by reference in its entirety, and priority thereto for common subject matter is hereby claimed.

TECHNICAL FIELD

The present invention relates, in general, to electronics and, more particularly, to semiconductor structures thereof, and methods of forming semiconductor devices.

BACKGROUND

In the past, semiconductor manufacturers have used a combination of silicon semiconductor materials and III-N semiconductor materials to manufacture cascoded devices, such as a normally-on III-N depletion mode HEMT cascoded with an enhancement mode silicon device. Using this combination of materials helps achieve a normally-off state using a III-N depletion mode device that is normally-on. In cascoded devices configured as switches, the silicon device often operates in avalanche mode due to high leakage currents of the III-N device operating under a high drain bias. In the avalanche operating mode, the gate of the III-N device is under a large stress in which the absolute gate to source voltage exceeds the devices pinch-off voltage. Hard stress conditions such as operating the silicon device in the avalanche mode degrades device reliability, lowers the breakdown voltage, and increases leakage currents. Cascoded semiconductor devices have been described in U.S. Patent Application Publication Number 2013/0088280 A1 by Rakesh K. Lai et al. and published on Apr. 11, 2013.

After manufacturing cascoded devices from different semiconductor substrate materials, semiconductor component manufacturers typically protect the silicon device and the depletion mode devices in separate packages and connect the devices in the separate packages together via leadframe leads to form a cascoded device. A drawback with this approach is that increasing the number of packages increases the cost of a cascoded semiconductor component and degrades the performance of the cascoded devices because of increased parasitics such as parasitic capacitance and parasitic inductance.

Accordingly, it would be advantageous to have a cascoded semiconductor device and a method for manufacturing the cascoded semiconductor device. It would be of further advantage for the structure and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
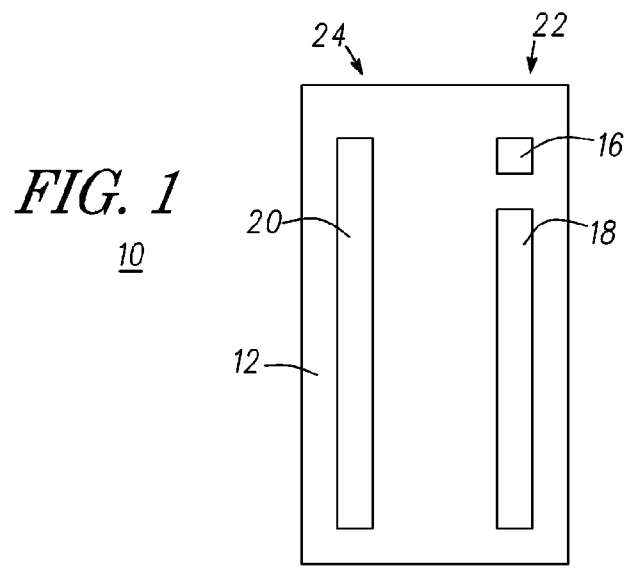
FIG. 1 is a top view of a semiconductor chip suitable for use in manufacturing a semiconductor component in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

DETAILED DESCRIPTION

FIG. 1 is a top view of a semiconductor chip 10 suitable for use in manufacturing a semiconductor component in accordance with another embodiment of the present invention. Semiconductor chip 10 has a top surface 12 and a bottom surface 14 (shown in FIGS. 5 and 6), wherein a gate bond pad 16 is formed on or from a portion of top surface 12, a source bond pad 18 is formed on or from another portion of top surface 12, and a drain bond pad 20 is formed on or from another portion of top surface 12. Gate bond pad 16 and source bond pad 18 are formed on a side 22 of semiconductor chip 10 and drain bond pad 20 is formed on a side 24 of semiconductor chip 10. Sides 22 and 24 are on opposite sides of semiconductor chip 10. Semiconductor chip 10 is fabricated from a compound semiconductor material such as, for example, a III-nitride semiconductor material. Thus, semiconductor chip 10 may be referred to as a III-nitride semiconductor chip, i.e., the substrate material of III-nitride semiconductor chip 10 comprises a III-nitride material such as, for example, aluminum nitride. A III-nitride semiconductor material may be referred to as a III-N semiconductor material, a III-nitride based semiconductor material, a III-N based semiconductor material, or the like. Although the substrate material of semiconductor chip 10 has been described as a III-N material, this is not a limitation. Alternatively, the substrate material of semiconductor chip 10 can be silicon, silicon carbide, or the like. This material may be referred to as a body of semiconductor material. A semiconductor chip such as, for example, semiconductor chip 10, may be referred to as a semiconductor die.

Figure 2:
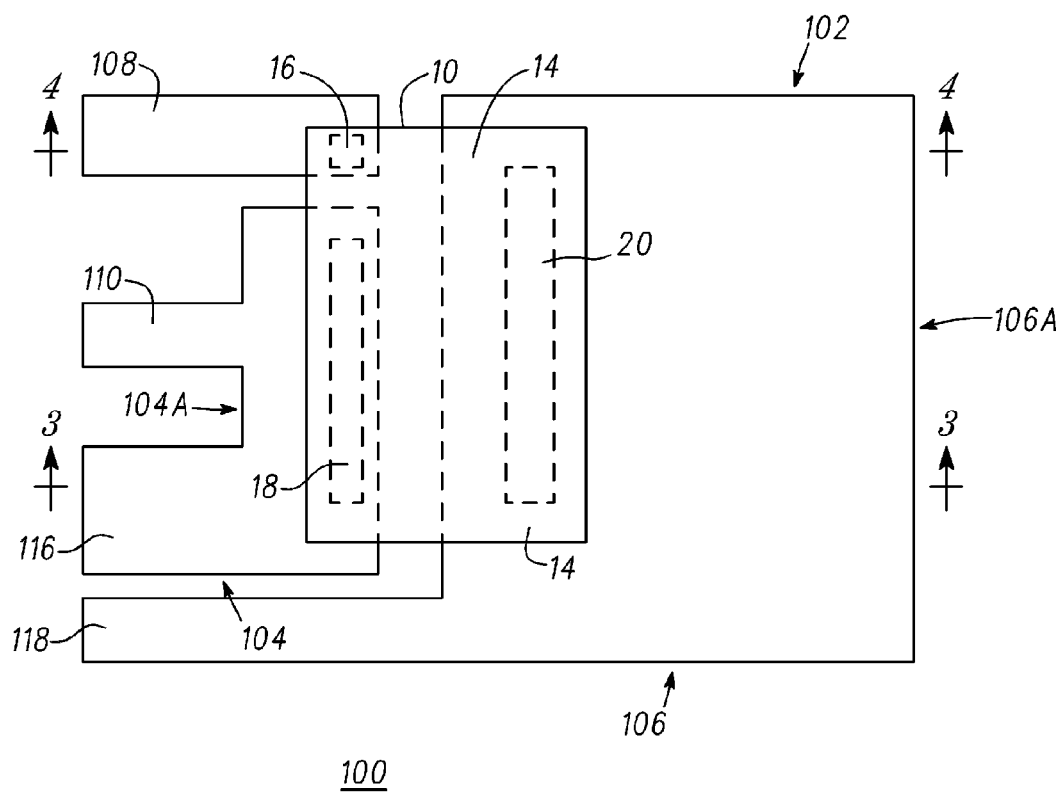
FIG. 2 is a top view of a cascode connected semiconductor component configured for packaging in a through hole package in accordance with another embodiment of the present invention.

FIG. 2 is a top view of a semiconductor component 100 comprising a support 102 to which a semiconductor chip 10 is mounted in a flip-chip configuration, wherein support 102 is configured for packaging in a through hole package. More particularly, support 102 may be manufactured from an electrically conductive material such as, for example, copper. Support 102 includes device receiving portions 104 and 106, wherein a portion of semiconductor chip 10, i.e., source bond pad 18 on side 22 of semiconductor chip 10, is electrically connected to device receiving portion 104 and a portion of semiconductor chip 10, i.e., a drain bond pad 20 on side 24 of semiconductor chip 10, is electrically connected to device receiving portion 106. Device receiving portions 104 and 106 are comprised of an electrically conductive material. Device receiving portion 104 is an electrically conductive "F" shaped structure having a rectangularly shaped body 104A from which a source lead 116 extends and a Kelvin lead 110 extends. Thus, source lead 116 and Kelvin lead 110 are integral with and extend from device receiving portion 104. In accordance with an embodiment, Kelvin lead 110 extends from a central region of rectangularly shaped body 104A and source lead 116 extends from an end region of rectangularly shaped body 104A. It should be noted that source lead 116 is shown as being wider than Kelvin lead 110, however this is not a limitation of the present invention. For example, source lead 116 and Kelvin lead 110 can have the same width or Kelvin lead 110 can be wider than source lead 116.

Device receiving portion 106 is an electrically conductive structure having a square shaped region 106A and a rectangularly shaped extension extending from a corner of square shaped region 106A that serves as drain lead 118. Thus, drain lead 118 is integral with and extends from device receiving portion 106. In accordance with an embodiment, device receiving portion 106 may have a square shape when viewed from a top view. Alternatively, device receiving portion 106 may have a rectangular shape when viewed from a top view or a polygonal shaped when viewed from a top view, or a circular shape when viewed as a top view, or an elliptical shape when viewed as a top view, or the like. Device receiving portions 104 and 106 may be referred to as mating portions. The shapes of device receiving portions 104 and 106 are not limitations of the present invention.

Support 102 is further configured to have a rectangularly shaped electrically conductive structure 108 adjacent to but electrically isolated from device receiving portion 104 and device receiving portion 106. In accordance with an embodiment, rectangularly shaped electrically conductive structure 108 serves as a gate lead.

Semiconductor device 10 is coupled to or attached to support 102 in a flip-chip configuration, wherein a portion of surface 12 of semiconductor device 10 faces device receiving portion 104 and a portion of surface 12 faces device receiving portion 106. More particularly, a bonding agent such as, for example solder is formed on the source lead and a bonding agent is formed on a portion of device support structure 106. Source bond pad 18 of III-N semiconductor chip 10 is bonded to source lead 116 through a bonding agent and drain bond pad 20 of III-N semiconductor chip 10 is bonded to device receiving portion 106 through a bonding agent. As described above, suitable materials for the bonding agent include solder, an electrically conductive epoxy, an electrically conductive material, or the like. Preferably, the bonding agent is a thermally conductive material. Gate bond pad 16 is bonded to gate lead 108 using a bonding agent. Because semiconductor chip 10 is in a flip-chip configuration, gate bond pad 16, source bond pad 18, and drain bond pad 20 are hidden from view in a top view. Accordingly, gate bond pad 16, source bond pad 18, and drain bond pad 20 are shown as rectangular structures formed by broken lines or dashed lines.

As those skilled in the art are aware, support 102, including device receiving portions 104 and 106 and semiconductor chip 10, may be encapsulated in a protective material such as, for example a mold compound. It should be noted that after encapsulation, gate lead 108, Kelvin lead 110, source lead 116, and drain lead 118 extend from the mold compound. In a through hole package, leads 108, 110, 116, and 118 extend from the mold compound and are substantially coplanar. However, drain lead 118 has a downward bend so that device receiving portion 106 is below the plane of device receiving portion 104. Thus, an electrically conductive pedestal extends upward from device receiving portion 106 a distance such that it has a surface that is substantially coplanar with device receiving portion 104 and so that surface 12 of semiconductor chip 10 is substantially parallel to device receiving portion 104 and to the surface of the pedestal of device receiving portion 106. In accordance with an embodiment, the mold compound is a thermally enhanced mold compound. For the sake of clarity, the mold compound is absent from FIG. 2. In this configuration, the substrate of semiconductor chip 10 is electrically isolated from leads 108, 110, 116, and 118. Thus, the substrate of semiconductor 10 is floating.

It should be noted that support 102 is illustrated and described as a single element; however, it may be a portion singulated from a leadframe strip. Support 102 conforms with through hole package outlines such as a TO-220 outline, a TO-247 outline, a TO-264 outline, a TO-257 outline, or the like.

Figure 3:
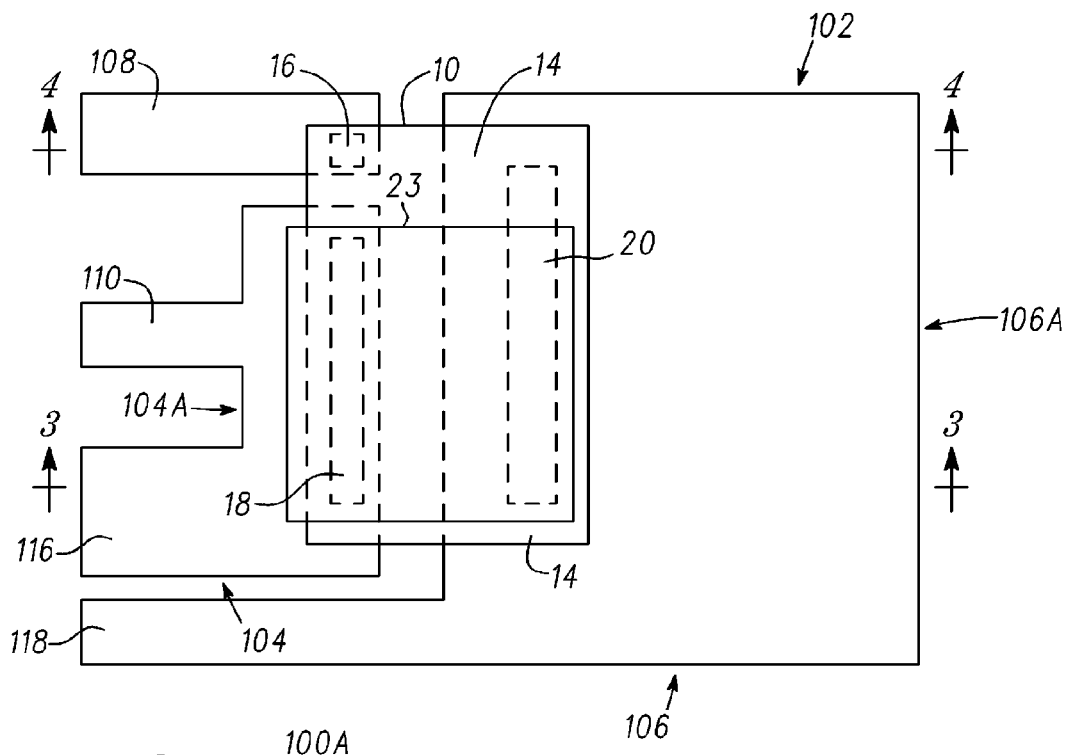
FIG. 3 is a top view of a cascode connected semiconductor component configured for packaging in a through hole package in accordance with another embodiment of the present invention.

FIG. 3 is a top view of a semiconductor component 100A comprising a support 102 to which a semiconductor chip 10 is mounted in a flip-chip configuration, wherein support 102 is configured to be packaged in a through hole package. Semiconductor component 100A is the same as semiconductor component 100 with the addition of an electrically conductive interconnect 23 that electrically connects the substrate or body region of semiconductor chip 10 to device receiving portion 104. By way of example, electrically conductive interconnect 23 is a clip having an end connected to or bonded to the substrate of semiconductor chip 10 and another end electrically connected to or bonded to source lead 116 and to Kelvin lead 110. Thus, electrically conductive clip 23 electrically connects the substrate of semiconductor chip 10 to the source of semiconductor chip 10 so that the substrate and source of semiconductor chip 10 are shorted together or at the same potential.

It should be noted that support 102 is illustrated and described as a single element; however, it may be a portion singulated from a leadframe strip. Support 102 conforms with through hole package outlines such as a TO-220 outline, a TO-247 outline, a TO-264 outline, a TO-257 outline, or the like.

Figure 4:
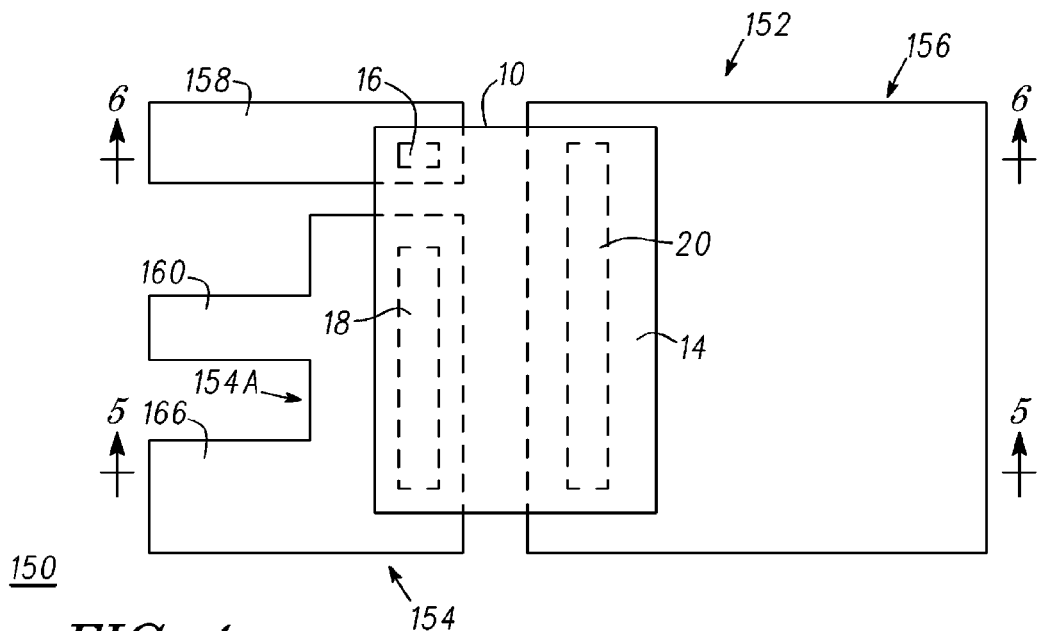
FIG. 4 is a top view of a cascode connected semiconductor component configured for packaging in a QFN package in accordance with another embodiment of the present invention.
Figure 5:
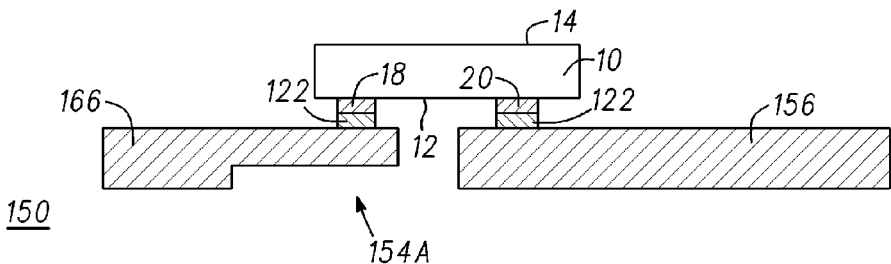
FIG. 5 is a cross-sectional view of the semiconductor component of FIG. 4 taken along section line 5-5 of FIG. 4.
Figure 6:
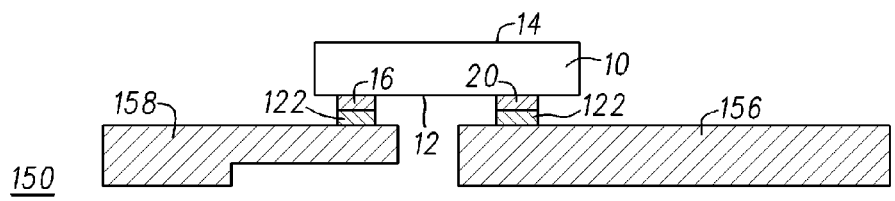
FIG. 6 is a cross-sectional view of the semiconductor component of FIG. 4 taken along section line 6-6 of FIG. 4.

FIG. 4 is a top view of a semiconductor component 150 comprising a support 152 to which a semiconductor chip 10 is mounted in a flip-chip configuration, wherein support 152 is configured for packaging in a QFN package. FIG. 5 is a cross-sectional view of semiconductor component 150 taken along section line 5-5 of FIG. 4 and FIG. 6 is a cross-sectional view of semiconductor component 150 taken along section line 6-6 of FIG. 4. For the sake of clarity, FIGS. 4-6 are described together. More particularly, support 152 may be manufactured from an electrically conductive material such as, for example, copper. Support 152 includes device receiving portions 154 and 156, wherein a portion of semiconductor chip 10, i.e., source bond pad 18 on side 22 of semiconductor chip 10, is electrically connected to device receiving portion 154 and a portion of semiconductor chip 10, i.e., a drain bond pad 20 on side 24 of semiconductor chip 10, is electrically connected to device receiving portion 156. Device receiving portions 154 and 156 are electrically conductive structures. Device receiving portion 154 is an electrically conductive "F" shaped structure having a rectangularly shaped body 154A from which a source lead 166 extends and a Kelvin lead 160 extends. In accordance with an embodiment, Kelvin lead 160 extends from a central region of rectangularly shaped body 154A and source lead 166 extends from an end region of rectangularly shaped body 154A. It should be noted that source lead 166 is shown as being wider than Kelvin lead 160, however this is not a limitation of the present invention. For example, source lead 166 and Kelvin lead 160 can have the same width or Kelvin lead 160 can be wider than source lead 166.

In accordance with an embodiment, device receiving portion 156 may have a square shape when viewed as a top view. Alternatively, device receiving portion 156 may have a rectangular shape when viewed from a top view or a polygonal shape when viewed from a top view, or a circular shape when viewed from a top view, or an elliptical shape when viewed from a top view, or the like. Device receiving portions 154 and 156 may be referred to as mating portions. The shapes of device receiving portions 154 and 156 are not limitations of the present invention.

Support 152 is further configured to have a rectangularly shaped electrically conductive structure 158 adjacent to but electrically isolated from device receiving portion 154 and device receiving portion 156. In accordance with an embodiment, rectangularly shaped electrically conductive structure 158 serves as a gate lead.

Semiconductor device 10 is coupled to or attached to support 152 in a flip-chip configuration, wherein a portion of surface 12 of semiconductor device 10 faces device receiving portion 154 and a portion of surface 12 faces device receiving portion 156. More particularly, a bonding agent 122 such as, for example solder is formed on source lead 166 and a bonding agent 122 is formed on a portion of device support structure 156. Source bond pad 18 of III-N semiconductor chip 10 is bonded to source lead 166 through bonding agent 122 and drain bond pad 20 of III-N semiconductor chip 10 is bonded to device receiving portion 156 through bonding agent 122 as shown in FIG. 5. As described above, suitable materials for bonding agent 122 include solder, an electrically conductive epoxy, an electrically conductive material, or the like. Gate bond pad 16 is bonded to gate lead 158 using bonding agent 122 as shown in FIG. 6. Because semiconductor chip 10 is in a flip-chip configuration, gate bond pad 16, source bond pad 18, and drain bond pad 20 are hidden from view in a top view. Accordingly, gate bond pad 16, source bond pad 18, and drain bond pad 20 are shown as rectangular structures formed by broken lines or dashed lines in FIG. 4.

As those skilled in the art are aware, support 152, including device receiving portions 154 and 156 and semiconductor chip 10, may be encapsulated in a protective material such as, for example a mold compound. It should be noted that after encapsulation, gate lead 158, Kelvin lead 160, and source lead 166 extend from a side of the mold compound and are substantially coplanar and that device receiving portion 156 serves as the drain of semiconductor component 150. Thus, a surface of device receiving portion 156 at a back side of the QFN package is exposed to facilitate electrically contacting the drain of semiconductor component 150. In accordance with an embodiment, the mold compound is a thermally enhanced mold compound. For the sake of clarity, the mold compound is absent from FIGS. 4-6.

Figure 7:
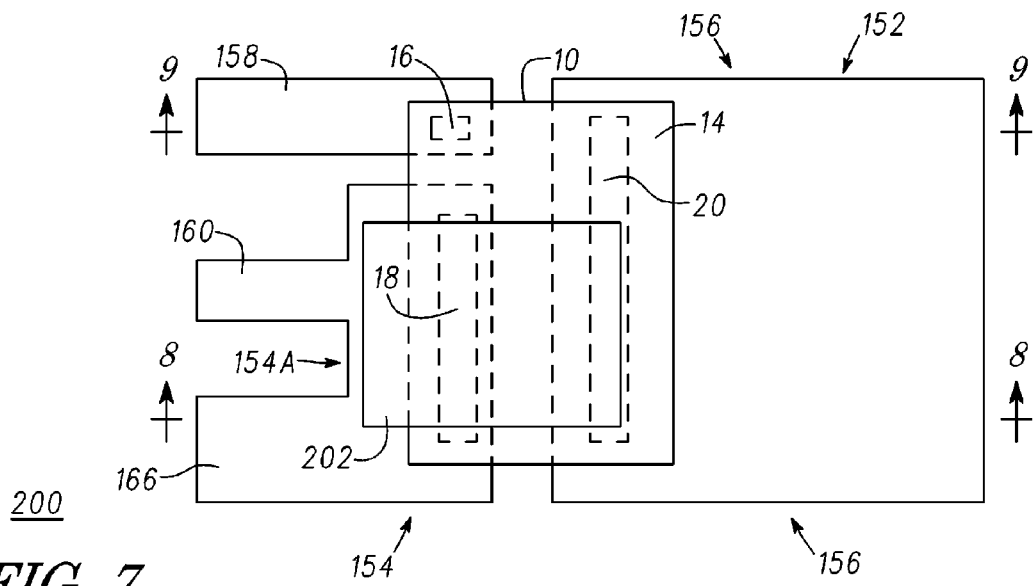
FIG. 7 is a top view of a cascode connected semiconductor component configured for packaging in a QFN package in accordance with another embodiment of the present invention.
Figure 8:
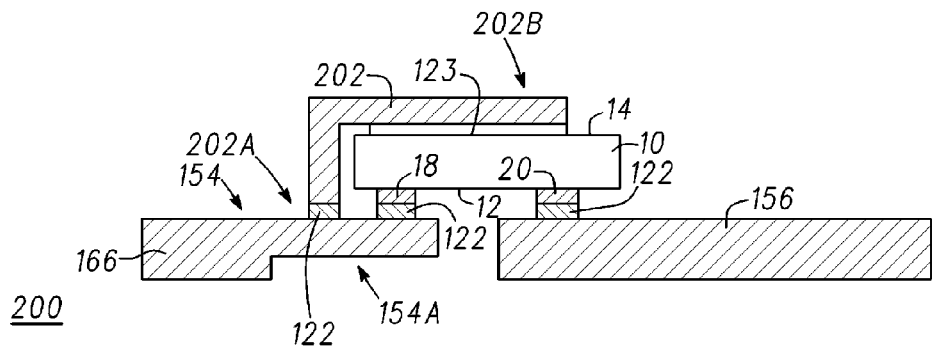
FIG. 8 is a cross-sectional view of the semiconductor component of FIG. 7 taken along section line 8-8 of FIG. 7.
Figure 9:
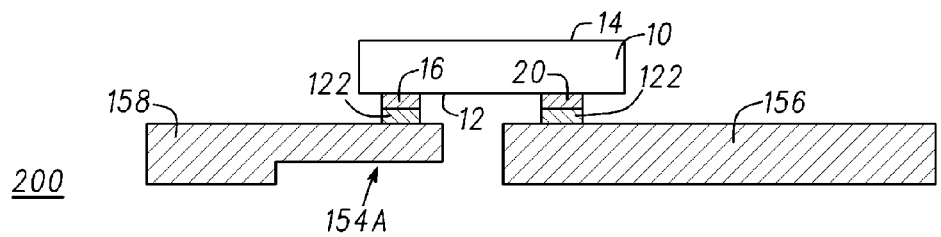
FIG. 9 is a cross-sectional view of the semiconductor component of FIG. 7 taken along section line 9-9 of FIG. 7.

FIG. 7 is a top view of a semiconductor component 200 comprising a support 152 to which a semiconductor chip 10 is mounted in a flip-chip configuration, wherein support 152 is configured for packaging in a QFN package. FIG. 8 is a cross-sectional view of semiconductor component 200 taken along section line 8-8 of FIG. 7. FIG. 9 is a cross-sectional view of semiconductor component 200 taken along section line 9-9 of FIG. 7. For the sake of clarity, FIGS. 7-9 are described together. Support 152 and the mounting of semiconductor chip 10 to support 152 are described with reference to FIGS. 4-6. It should be noted that reference character 200 of FIGS. 7-9 corresponds to reference character 150 of FIGS. 4-6, section line 8-8 of FIG. 7 corresponds to section line 5-5 of FIG. 4, and section line 9-9 of FIG. 7 corresponds to section line 6-6 of FIG. 4. FIG. 7 further illustrates an electrically conductive interconnect 202 electrically connecting the substrate or body region of the semiconductor material of semiconductor chip 10 to rectangularly shaped body 154A, i.e., to source lead 166 and Kelvin lead 160. Connecting the substrate of the semiconductor material of semiconductor chip 10 to rectangularly shaped body 154A enables biasing the semiconductor material, i.e., the substrate, of semiconductor chip 10 to the same potential as the source of semiconductor chip 10. Electrically conductive clip 202 has an end 202A electrically connected to rectangularly shaped body 154A through bonding agent 122 and an end 202B electrically connected to the substrate material of semiconductor chip 10 through die attach material 123.

FIG. 9 illustrates that gate bond pad 16 is bonded to gate lead 108 using bonding agent 122.

Support 152 including device receiving portions 154 and 156, semiconductor chip 10, and electrically conductive clip 202 may be encapsulated in a protective material such as, for example a mold compound. It should be noted that after encapsulation, gate lead 158, Kelvin lead 160, and source lead 166 extend from a side of the mold compound and are substantially coplanar and that device receiving portion 156 serves as the drain of semiconductor component 200. Thus, a surface of device receiving portion 156 at a back side of the QFN package is exposed to facilitate electrically contacting the drain of semiconductor component 200. In accordance with an embodiment, the mold compound is a thermally enhanced mold compound. For the sake of clarity, the mold compound is absent from FIGS. 7-9.

Figure 10:
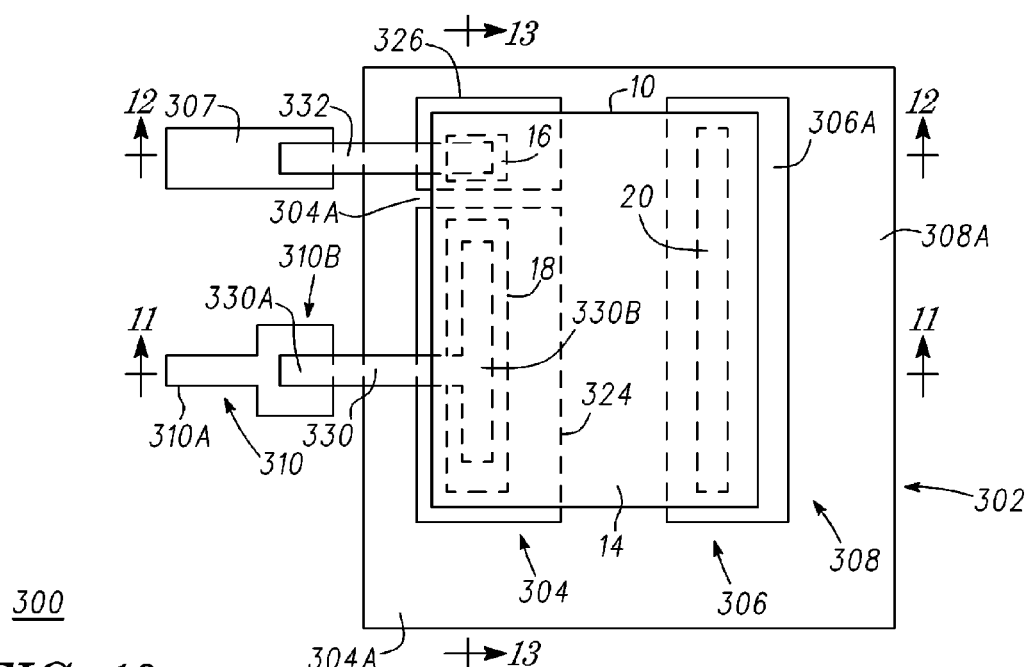
FIG. 10 is a top view of a cascode connected semiconductor component configured for packaging in a QFN package in accordance with another embodiment of the present invention.
Figure 11:
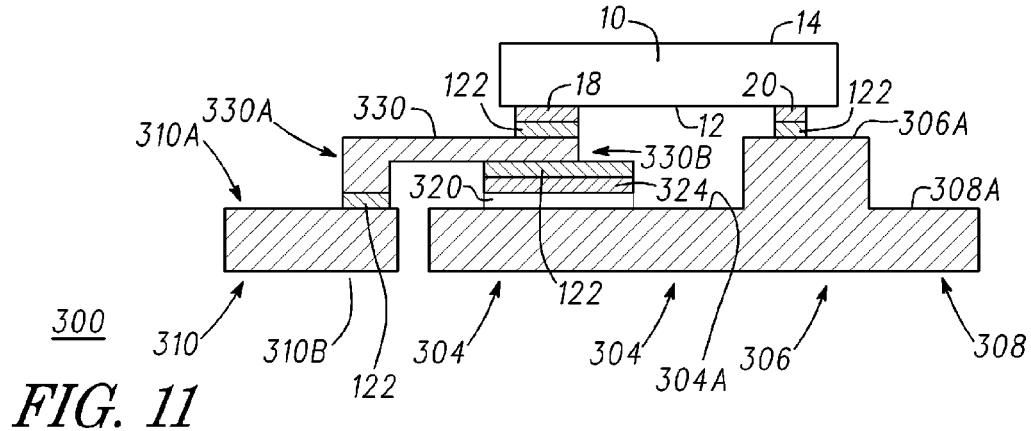
FIG. 11 is a cross-sectional view of the semiconductor component of FIG. 10 taken along section line 11-11 of FIG. 10.
Figure 12:
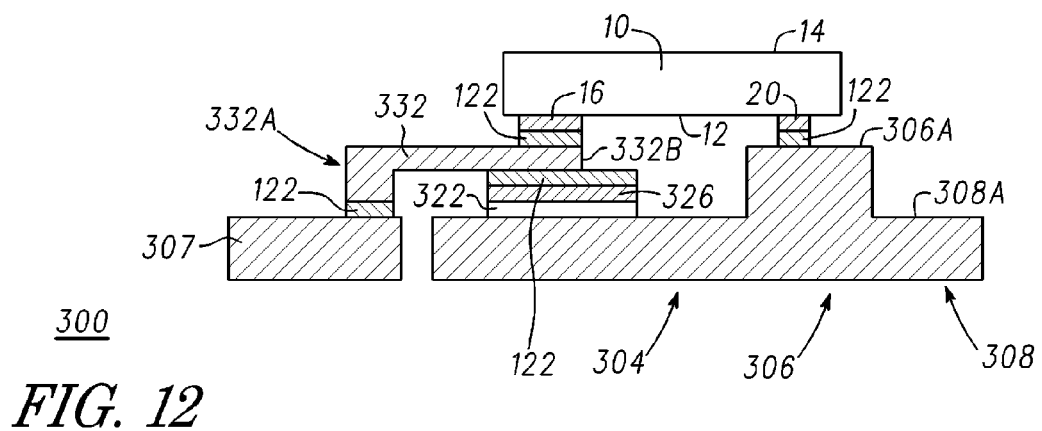
FIG. 12 is a cross-sectional view of the semiconductor component of FIG. 10 taken along section line 12-12 of FIG. 10.
Figure 13:
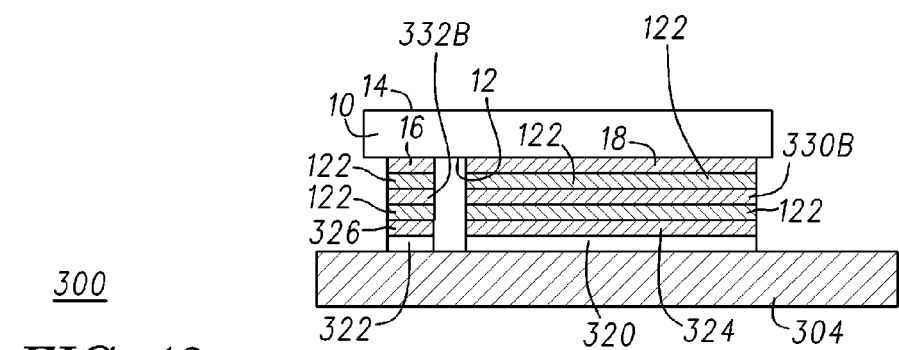
FIG. 13 is a cross-sectional view of the semiconductor component of FIG. 10 taken along section line 13-13 of FIG. 10.

FIG. 10 is a top view of a semiconductor component 300 comprising a support 302 to which a semiconductor chip 10 is mounted in a flip-chip configuration, wherein support 302 is configured for packaging in a QFN package. FIG. 11 is a cross-sectional view of semiconductor component 300 taken along section line 11-11 of FIG. 10; FIG. 12 is a cross-sectional view of semiconductor component 300 taken along section line 12-12 of FIG. 10; and FIG. 13 is a cross-sectional view of semiconductor component 300 taken along section line 13-13 of FIG. 10. For the sake of clarity, FIGS. 10-13 are described together. Support 302 may be a rectangularly shaped structure manufactured from an electrically conductive material such as, for example, copper. Support 302 is comprised of regions 304, 306, and 308, where regions 304 and 308 are separated from each other by region 306. Regions 304 and 308 have surfaces 304A and 308A that are in substantially the same plane and region 306 has a surface 306A that is in a plane that is above the plane in which surfaces 304A and 308A are located. Region 304 serves as a device receiving region and region 306 serves as a device receiving region.

Device receiving region 306 is comprised of an electrically conductive pedestal that extends upward from surface 304A a distance such that it has a surface 306A that is substantially coplanar with the surface of portion 330B of clip 330 and the surface of portion 332B of clip 332. Pedestal or device receiving region 306 may be a unitary structure formed with support 302 or it may be an electrically conductive material electrically bonded to support 302.

Support 302 is further configured to have a rectangularly shaped electrically conductive structure 307 adjacent to but electrically isolated from device receiving portion 304. In accordance with another embodiment, rectangularly shaped electrically conductive structure 307 serves as a gate lead.

Support 302 is further configured to have an electrically conductive structure 310 adjacent to but electrically isolated from device receiving portion 302. Electrically conductive structure 310 serves as a source lead. By way of example, source lead 310 is comprised of a rectangular portion 310A and a rectangular portion 310B, wherein portions 310A and 310B form a "T-shape." The shape of device receiving portion 302 and leads 307 and 310 are not limitations of the present invention.

An electrically insulating material 320 is formed on a first portion of region 304 (shown in FIG. 11) and an electrically insulating material 322 is formed on a second portion of region 304 (shown in FIG. 12). By way of example, electrically insulating material 320 and electrically insulating material 322 are ceramic. Although electrically insulating materials 320 and 322 are shown and described as being separate structures, they may be a single unitary structure. A layer of electrically conductive material 324 (shown in FIG. 11) is formed on electrically insulating material 320 and a layer of electrically conductive material 326 is formed on electrically insulating material 322 (shown in FIG. 12). By way of example, electrically conductive layers 324 and 326 are copper.

A clip 330 having terminals 330A and 330B electrically connects electrically conductive layer 324 with source lead 310, wherein terminal 330A of clip 330 is electrically bonded to source lead 310 using a bonding agent 122 and terminal 330B of clip 330 is electrically connected to electrically conductive layer 324 using bonding agent 122. Suitable materials for bonding agent 122 have been described above.

A clip 332 having terminals 332A and 332B electrically connects electrically conductive layer 326 with gate lead 307, where terminal 332A of clip 332 is electrically bonded to gate lead 307 using bonding agent 122 and terminal 332B of clip 332 is electrically connected to electrically conductive layer 326 using bonding agent 122. Suitable materials for bonding agent 122 have been described above.

Electrically insulating layer 320, bonding agent 122, electrically conductive material 324, and terminal 330B of clip 330 have a combined thickness substantially equal to a vertical distance from the plane formed by surface 304A and the plane formed by surface 306A. Electrically insulating material 322, bonding agent 122, electrically conductive material 326, and terminal 332B of clip 332 have a combined thickness substantially equal to a vertical distance from the plane formed by surface 304A and the plane formed by surface 306A.

Semiconductor chip 10 is coupled to or attached to support 302 in a flip-chip configuration, where a portion of surface 12 of semiconductor device 10 faces device receiving portion 304. More particularly, a bonding agent 122 is formed on terminal 330B of clip 330 and a bonding agent 122 is formed on surface 306A. Source bond pad 18 of III-N semiconductor chip 10 is bonded to terminal 330B of clip 330 through bonding agent 122 and drain bond pad 20 of III-N semiconductor chip 10 is bonded to surface 306A through bonding agent 122 as shown in FIG. 12. A bonding agent 122 is formed on gate lead 307 and a bonding agent 122 is formed on electrically conductive layer 326. Gate bond pad 16 of III-N semiconductor chip 10 is bonded to gate lead 307 through clip 332 and bonding agent 122, drain bond pad 20 of III-N semiconductor chip 10 is bonded to surface 306A through bonding agent 122 as shown in FIG. 13, and source bond pad 18 of III-N semiconductor chip 10 is bonded to source lead 310 through clip 330 and bonding agent 122.

Suitable materials for bonding agent 122 have been described above. Because semiconductor chip 10 is in a flip-chip configuration, gate bond pad 16, source bond pad 18, and drain bond pad 20 are hidden from view in a top view. Accordingly, gate bond pad 16, source bond pad 18, and drain bond pad 20 are shown as rectangular structures formed by broken lines or dashed lines in FIG. 10.

Support 302 including device receiving portion 304, semiconductor chip 10, and of electrically conductive clips 330 and 332 may be encapsulated in a protection material such as, for example a mold compound. In a QFN package, leads 307 and 310 extend from the mold compound and are substantially coplanar. Device receiving portion 306 and region 308 serve as the drain of semiconductor component 300A. Thus, a surface of device receiving portion 306 and region 308 at a back side of the QFN package is exposed to facilitate electrically contacting the drain of semiconductor component 300A. In accordance with an embodiment, the mold compound is a thermally enhanced mold compound. For the sake of clarity, the mold compound is absent from FIGS. 10-13.

Figure 14:
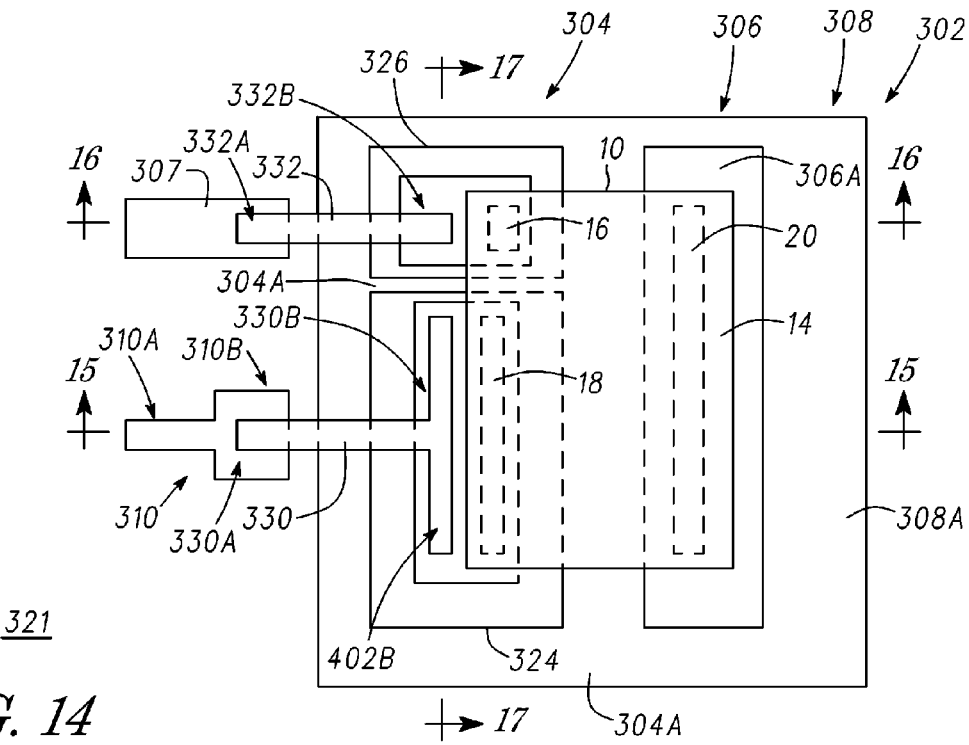
FIG. 14 is a top view of a cascode connected semiconductor component configured for packaging in a QFN package in accordance with another embodiment of the present invention.
Figure 15:
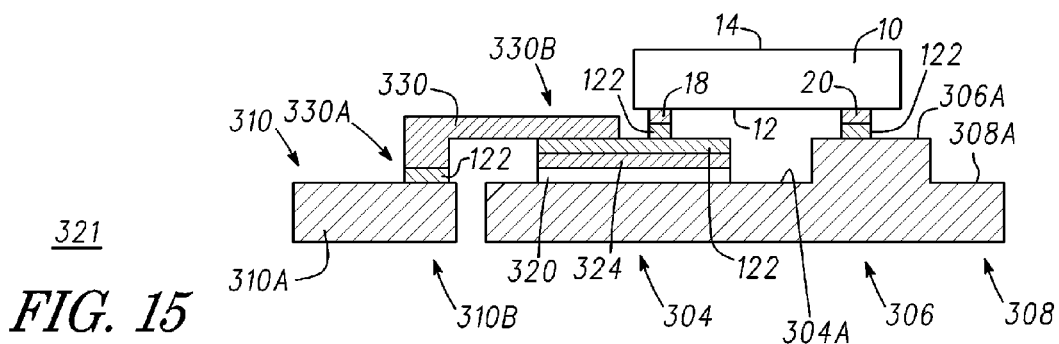
FIG. 15 is a cross-sectional view of the semiconductor component of FIG. 14 taken along section line 15-15 of FIG. 14.
Figure 16:
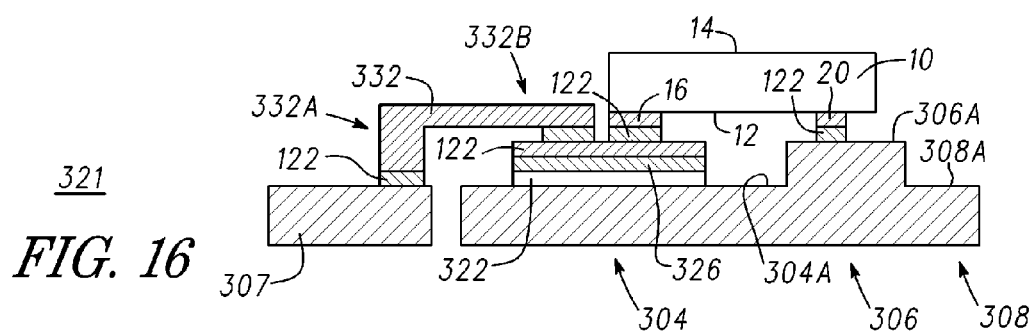
FIG. 16 is a cross-sectional view of the semiconductor component of FIG. 14 taken along section line 16-16 of FIG. 14.
Figure 17:
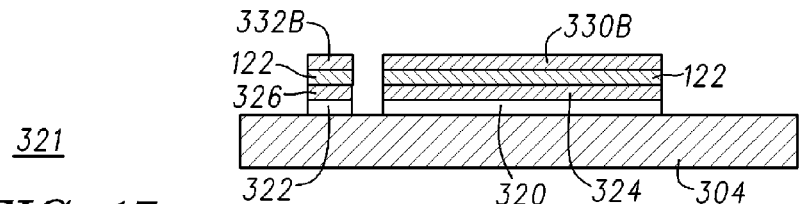
FIG. 17 is a cross-sectional view of the semiconductor component of FIG. 14 taken along section line 17-17 of FIG. 14.

FIG. 14 is a top view of a semiconductor component 321 comprising a support 302 to which a semiconductor chip 10 is mounted in a flip-chip configuration, wherein support 302 is configured for packaging in a QFN package. FIG. 15 is a cross-sectional view of semiconductor component 321 taken along section line 15-15 of FIG. 14; FIG. 16 is a cross-sectional view of semiconductor component 321 taken along section line 16-16 of FIG. 14; and FIG. 17 is a cross-sectional view of semiconductor component 321 taken along section line 17-17 of FIG. 14. For the sake of clarity, FIGS. 14-17 are described together. Support 302 may be a rectangularly shaped structure manufactured from an electrically conductive material such as, for example, copper. Support 302 is comprised of regions 304, 306, and 308, where regions 304 and 308 are separated from each other by region 306. Regions 304 and 308 have surfaces 304A and 308A that are in substantially the same plane and region 306 has a surface 306A that is in a plane that is above the plane in which surfaces 304A and 308A are located. Region 304 serves as a device receiving region and region 306 serves as a device receiving region.

Device receiving region 306 is comprised of an electrically conductive pedestal that extends upward from surface 304A a distance such that it has a surface 306A that is substantially coplanar with the surface of portion 330B of clip 330 and the surface of portion 332B of clip 332. Pedestal or device receiving region 306 may be a unitary structure formed with support 302 or it may be an electrically conductive material electrically bonded to support 302.

Support 302 is further configured to have a rectangularly shaped electrically conductive structure 307 adjacent to but electrically isolated from device receiving portion 304. In accordance with another embodiment, rectangularly shaped electrically conductive structure 307 serves as a gate lead.

Support 302 is further configured to have an electrically conductive structure 310 adjacent to but electrically isolated from device receiving portion 302. Electrically conductive structure 310 serves as a source lead. By way of example, source lead 310 is comprised of a rectangular portion 310A and a rectangular portion 310B, wherein portions 310A and 310B form a "T-shape." The shape of device receiving portion 302 and leads 307 and 310 are not limitations of the present invention.

An electrically insulating material 320 is formed on a first portion of region 304 (shown in FIG. 15) and an electrically insulating material 322 is formed on a second portion of region 304 (shown in FIG. 16). By way of example, electrically insulating material 320 and electrically insulating material 322 are ceramic. Although electrically insulating materials 320 and 322 are shown and described as being separate structures, they may be a single unitary structure. A layer of electrically conductive material 324 (shown in FIG. 15) is formed on electrically insulating material 320 and a layer of electrically conductive material 326 is formed on electrically insulating material 322 (shown in FIG. 16). By way of example, electrically conductive layers 324 and 326 are copper.

A clip 330 having terminals 330A and 330B electrically connects electrically conductive layer 324 with source lead 310, wherein terminal 330A of clip 330 is electrically bonded to source lead 310 using a bonding agent 122 and terminal 330B of clip 330 is electrically connected to electrically conductive layer 324 using bonding agent 122. Suitable materials for bonding agent 122 have been described above.

A clip 332 having terminals 332A and 332B electrically connects electrically conductive layer 326 with gate lead 307, where terminal 332A of clip 332 is electrically bonded to gate lead 307 using bonding agent 122 and terminal 332B of clip 332 is electrically connected to electrically conductive layer 326 using bonding agent 122. Suitable materials for bonding agent 122 have been described above.

Electrically insulating layer 320, bonding agent 122, electrically conductive material 324, and terminal 330B of clip 330 have a combined thickness substantially equal to a vertical distance from the plane formed by surface 304A and the plane formed by surface 306A. Electrically insulating material 322, bonding agent 122, electrically conductive material 326, and terminal 332B of clip 332 have a combined thickness substantially equal to a vertical distance from the plane formed by surface 304A and the plane formed by surface 306A.

Semiconductor chip 10 is coupled to or attached to support 302 in a flip-chip configuration, where a portion of surface 12 of semiconductor device 10 faces device receiving portion 304. More particularly, a bonding agent 122 is formed on electrically conductive material 324 and a bonding agent 122 is formed on surface 306A. Source bond pad 18 of III-N semiconductor chip 10 is bonded to electrically conductive material 324 through bonding agent 122 and drain bond pad 20 of III-N semiconductor chip 10 is bonded to surface 306A through bonding agent 122 as shown in FIG. 15. A bonding agent 122 is formed on gate lead 307 and a bonding agent 122 is formed on electrically conductive layer 326. Gate bond pad 16 of III-N semiconductor chip 10 is bonded to gate lead 307 through clip 332 and bonding agent 122, drain bond pad 20 of III-N semiconductor chip 10 is bonded to surface 306A through bonding agent 122 as shown in FIG. 16, and source bond pad 18 of III-N semiconductor chip 10 is bonded to source lead 310 through electrically conductive material 324, clip 330, and bonding agent 122.

Suitable materials for bonding agent 122 have been described above. Because semiconductor chip 10 is in a flip-chip configuration, gate bond pad 16, source bond pad 18, and drain bond pad 20 are hidden from view in a top view. Accordingly, gate bond pad 16, source bond pad 18, and drain bond pad 20 are shown as rectangular structures formed by broken lines or dashed lines in FIG. 14.

Support 302 including device receiving portion 304, semiconductor chip 10, and of electrically conductive clips 330 and 332 may be encapsulated in a protective material such as, for example a mold compound (not shown). In a QFN package, leads 307 and 310 extend from the mold compound and are substantially coplanar where device receiving portion 306 and region 308 serve as the drain of semiconductor component 321. Thus, a surface of device receiving portion 306 and region 308 at a back side of the QFN package is exposed to facilitate electrically contacting the drain of semiconductor component 300A. In accordance with an embodiment, the mold compound is a thermally enhanced mold compound. For the sake of clarity, the mold compound is absent from FIGS. 14-17.

Figure 18:
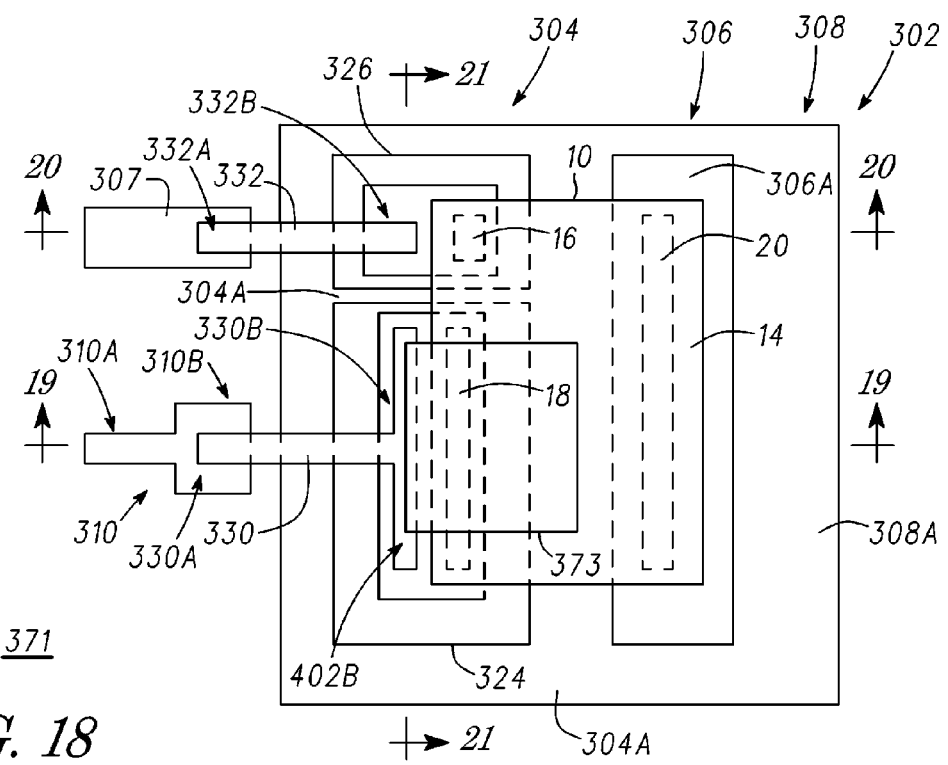
FIG. 18 is a top view of a cascode connected semiconductor component configured for packaging in a QFN package in accordance with another embodiment of the present invention.
Figure 19:
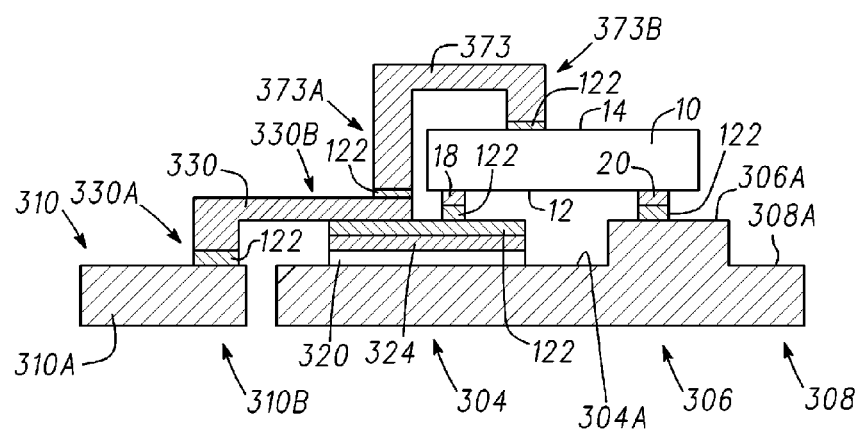
FIG. 19 is a cross-sectional view of the semiconductor component of FIG. 18 taken along section line 19-19 of FIG. 18.
Figure 20:
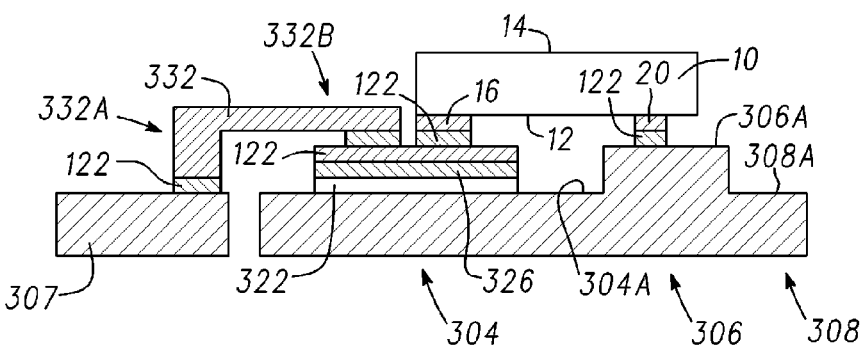
FIG. 20 is a cross-sectional view of the semiconductor component of FIG. 18 taken along section line 20-20 of FIG. 18.
Figure 21:
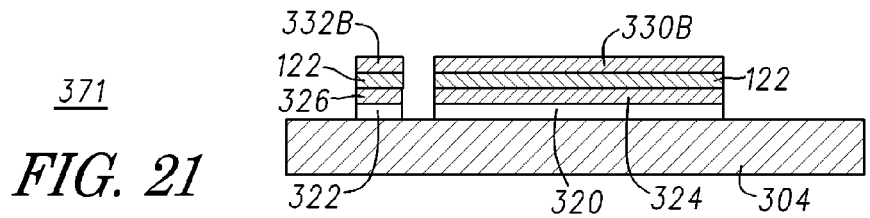
FIG. 21 is a cross-sectional view of the semiconductor component of FIG. 18 taken along section line 21-21 of FIG. 18.

FIG. 18 is a top view of a semiconductor component 371 comprising a support 302 to which a semiconductor chip 10 is mounted in a flip-chip configuration, wherein support 302 is configured for packaging in a QFN package. FIG. 19 is a cross-sectional view of semiconductor component 371 taken along section line 19-19 of FIG. 18; FIG. 20 is a cross-sectional view of semiconductor component 371 taken along section line 20-20 of FIG. 18; and FIG. 21 is a cross-sectional view of semiconductor component 371 taken along section line 21-21 of FIG. 18. For the sake of clarity, FIGS. 18-21 are described together. Support 302 may be a rectangularly shaped structure manufactured from an electrically conductive material such as, for example, copper. Support 302 is comprised of regions 304, 306, and 308, where regions 304 and 308 are separated from each other by region 306. Regions 304 and 308 have surfaces 304A and 308A that are in substantially the same plane and region 306 has a surface 306A that is in a plane that is above the plane in which surfaces 304A and 308A are located. Region 304 serves as a device receiving region and region 306 serves as a device receiving region.

Device receiving region 306 is comprised of an electrically conductive pedestal that extends upward from surface 304A a distance such that it has a surface 306A that is substantially coplanar with the surface of portion 330B of clip 330 and the surface of portion 332B of clip 332. Pedestal or device receiving region 306 may be a unitary structure formed with support 302 or it may be an electrically conductive material electrically bonded to support 302.

Support 302 is further configured to have a rectangularly shaped electrically conductive structure 307 adjacent to but electrically isolated from device receiving portion 304. In accordance with another embodiment, rectangularly shaped electrically conductive structure 307 serves as a gate lead.

Semiconductor component 371 is further configured to have an electrically conductive structure 310 adjacent to but electrically isolated from support 302. Electrically conductive structure 310 serves as a source lead. By way of example, source lead 310 is comprised of a rectangular portion 310A and a rectangular portion 310B, wherein portions 310A and 310B form a "T-shape." The shape of device receiving regions 304 and 306 and leads 307 and 310 are not limitations of the present invention.

An electrically insulating material 320 is formed on a first portion of region 304 (shown in FIG. 19) and an electrically insulating material 322 is formed on a second portion of region 304 (shown in FIG. 20). By way of example, electrically insulating material 320 and electrically insulating material 322 are ceramic. Although electrically insulating materials 320 and 322 are shown and described as being separate structures, they may be a single unitary structure. A layer of electrically conductive material 324 (shown in FIG. 19) is formed on electrically insulating material 320 and a layer of electrically conductive material 326 is formed on electrically insulating material 322 (shown in FIG. 20). By way of example, electrically conductive layers 324 and 326 are copper.

A clip 330 having terminals 330A and 330B electrically connects electrically conductive layer 324 with source lead 310, wherein terminal 330A of clip 330 is electrically bonded to source lead 310 using a bonding agent 122 and terminal 330B of clip 330 is electrically connected to electrically conductive layer 324 using bonding agent 122. Suitable materials for bonding agent 122 have been described above.

A clip 332 having terminals 332A and 332B electrically connects electrically conductive layer 326 with gate lead 307, where terminal 332A of clip 332 is electrically bonded to gate lead 307 using bonding agent 122 and terminal 332B of clip 332 is electrically connected to electrically conductive layer 326 using bonding agent 122. Suitable materials for bonding agent 122 have been described above.

Electrically insulating layer 320, bonding agent 122, electrically conductive material 324, and terminal 330B of clip 330 have a combined thickness substantially equal to a vertical distance from the plane formed by surface 304A and the plane formed by surface 306A. Electrically insulating material 322, bonding agent 122, electrically conductive material 326, and terminal 332B of clip 332 have a combined thickness substantially equal to a vertical distance from the plane formed by surface 304A and the plane formed by surface 306A.

Figure 22:
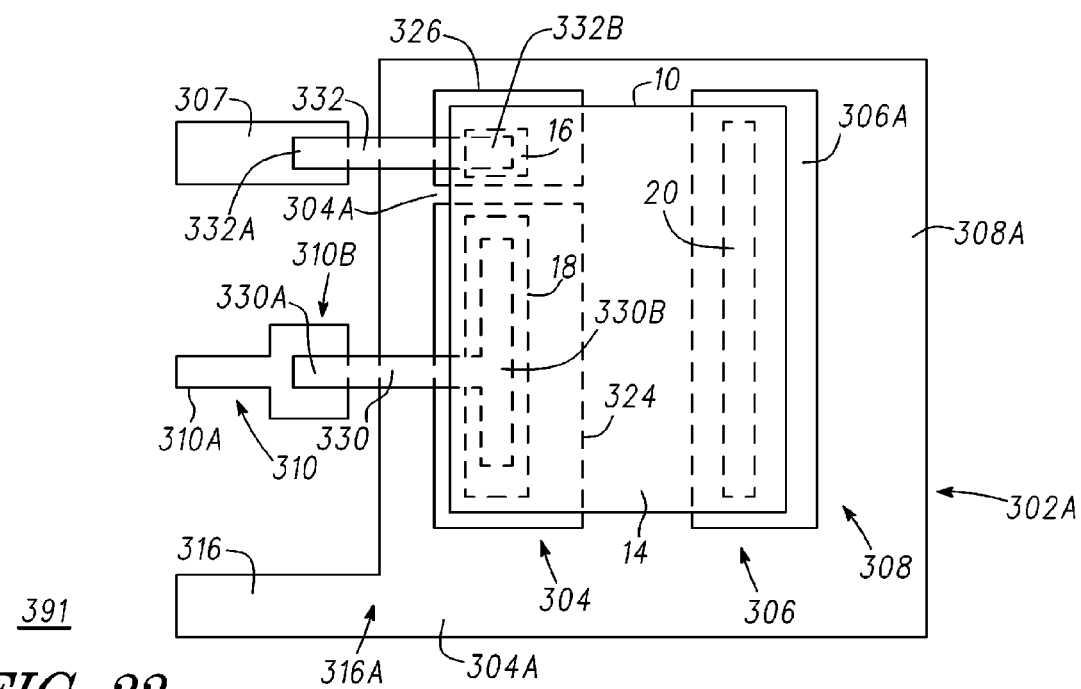
FIG. 22 is a top view of a cascode connected semiconductor component configured for packaging in a through hole package in accordance with another embodiment of the present invention.
Figure 23:
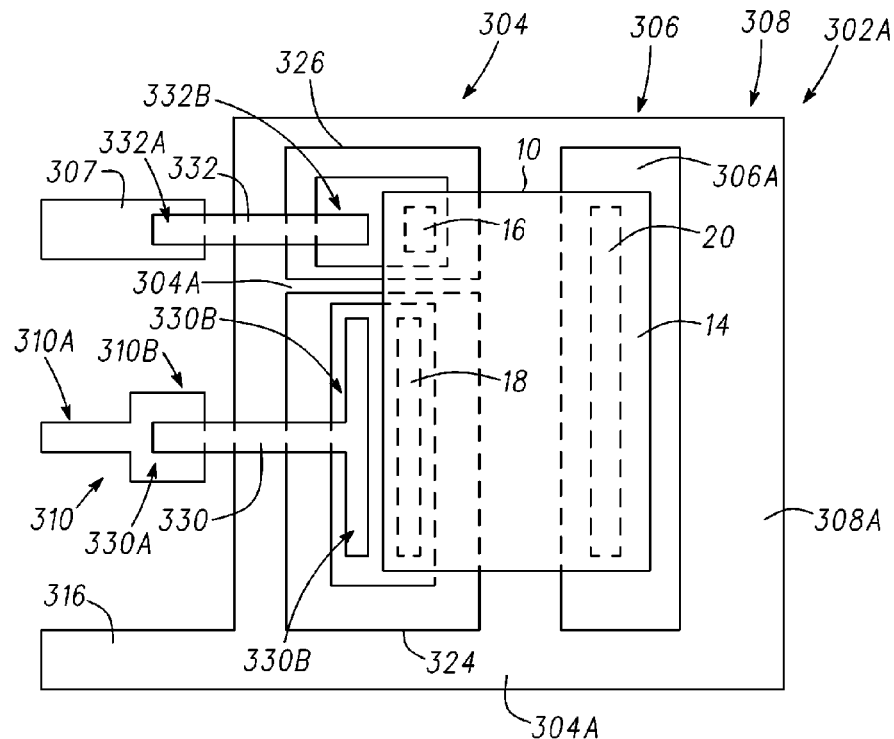
FIG. 23 is a top view of a cascode connected semiconductor component configured for packaging in a through hole package in accordance with another embodiment of the present invention.

Semiconductor chip 10 is coupled to or attached to support 302 in a flip-chip configuration, where a portion of surface 12 of semiconductor device 10 faces device receiving portion 304. More particularly, a bonding agent 122 is formed on electrically conductive material 324 and a bonding agent 122 is formed on surface 306A. Source bond pad 18 of III-N semiconductor chip 10 is bonded to electrically conductive material 324 through bonding agent 122 and drain bond pad 20 of III-N semiconductor chip 10 is bonded to surface 306A through bonding agent 122 as shown in FIG. 22. A bonding agent 122 is formed on gate lead 307 and a bonding agent 122 is formed on electrically conductive layer 326. Gate bond pad 16 of III-N semiconductor chip 10 is bonded to gate lead 307 through clip 332 and bonding agent 122, drain bond pad 20 of III-N semiconductor chip 10 is bonded to surface 306A through bonding agent 122 as shown in FIG. 23, and source bond pad 18 of III-N semiconductor chip 10 is bonded to source lead 310 through electrically conductive material 324, clip 330, and bonding agent 122.

Suitable materials for bonding agent 122 have been described above. Because semiconductor chip 10 is in a flip-chip configuration, gate bond pad 16, source bond pad 18, and drain bond pad 20 are hidden from view in a top view. Accordingly, gate bond pad 16, source bond pad 18, and drain bond pad 20 are shown as rectangular structures formed by broken lines or dashed lines.

A clip 373 having terminals 373A and 373B electrically connects the GaN substrate material semiconductor chip 10 to electrically conductive layer 324 and source lead 310, wherein terminal 373A of clip 373 is electrically bonded to clip 330 using a bonding agent 122 and terminal 373B of clip 373 is electrically connected to the III-N substrate material of semiconductor chip 10 using bonding agent 122. Suitable materials for bonding agent 122 have been described above. Thus, the substrate of semiconductor chip 10 is connected to its source electrode, i.e., the substrate and source (or source electrode) of semiconductor chip 10 are at the same potential.

Support 302 including device receiving portion 304, semiconductor chip 10, and electrically conductive clips 330, 332, and 373 may be encapsulated in a protection material such as, for example a mold compound (not shown). In a QFN package, leads 307 and 310 extend from the mold compound and are substantially coplanar where device receiving portion 306 and region 308 serve as the drain of semiconductor component 371. Thus, a surface of device receiving portion 306 and region 308 at a back side of the QFN package is exposed to facilitate electrically contacting the drain of semiconductor component 371. In accordance with an embodiment, the mold compound is a thermally enhanced mold compound. For the sake of clarity, the mold compound is absent from FIGS. 18-21.

FIG. 22 is a top view of a semiconductor component 391 comprising a support 302A to which a semiconductor chip 10 is mounted in a flip-chip configuration, wherein support 302A is configured through hole packaging. Support 302A may include a rectangularly shaped structure manufactured from an electrically conductive material such as, for example, copper. Support 302A is comprised of regions 304, 306, and 308, wherein regions 304 and 308 are separated from each other by region 306. Regions 304 and 308 have surfaces that are in substantially the same plane and region 306 has a surface that is in a plane that is above the plane in which the surfaces of regions 304 and 308 are located. Regions 304 and 306 serve as device receiving regions.

Support 302A is configured to have a rectangularly shaped electrically conductive structure 307 adjacent to but electrically isolated from device receiving portion 304 and an electrically conductive structure 310 adjacent to but electrically isolated from device receiving portion 304. Rectangularly shaped electrically conductive structure 307 serves as a gate lead and electrically conductive structure 310 serves as a source lead. By way of example, source lead 310 is comprised of a rectangular portion 310A and a rectangular portion 310B, wherein portions 310A and 310B form a "T-shape." An extension 316 extends from a corner of rectangularly shaped support 302 and serves as a drain lead. The shapes of support 302A including device receiving portions 304 and 306 and electrically conductive structures 307, 310, and 316 are not limitations of the present invention.

An electrically insulating material (not shown) is formed on a first portion of device receiving region 304 and an electrically insulating material (not shown) is formed on a second portion of device receiving region 304. By way of example, the electrically insulating materials formed on the first and second portions of device receiving region 304 are ceramic. It should be noted that the electrically insulating material may be a single piece of material or separate pieces of material. A layer of electrically conductive material 324 is formed on the first electrically insulating material on the first portion of device receiving region 304 and a layer of electrically conductive material 326 is formed on the electrically insulating material on the second portion of device receiving region 304. By way of example, electrically conductive layers 324 and 326 are copper.

A clip 330 having terminals 330A and 330B electrically connects electrically conductive layer 324 with source lead 310, wherein terminal 330A of clip 330 is electrically bonded to source lead 310 using a bonding agent and terminal 330B of clip 330 is electrically connected to electrically conductive layer 324 using a bonding agent. Suitable materials for the bonding agent have been described above.

A clip 332 having terminals 332A and 332B electrically connects electrically conductive layer 326 with gate lead 307, where terminal 332A of clip 332 is electrically bonded to gate lead 307 using a bonding agent and terminal 332B of clip 332 is electrically connected to electrically conductive layer 326 using a bonding agent. Suitable materials for the bonding agent have been described above.

The electrically insulating material formed on the first portion of device receiving region 304, the bonding agent, electrically conductive material 324, and terminal 330B of clip 330 have a combined thickness substantially equal to a vertical distance from the plane formed by surface 304A and the plane formed by the surface of region 306. Likewise, the electrically insulating material formed on the second portion of device receiving region 304, the bonding agent, electrically conductive material 326, and terminal 332B of clip 332 have a combined thickness substantially equal to a vertical distance from the plane formed by surface 304A and the plane formed by the surface of region 306.

Semiconductor chip 10 is coupled to or attached to support 302A in a flip-chip configuration, wherein a portion of surface 12 of semiconductor device 10 faces device receiving portion 304. More particularly, a bonding agent is formed on terminal 330B of clip 330 and a bonding agent is formed on the surface of device receiving region 306. Source bond pad 18 of III-N semiconductor chip 10 is bonded to terminal 330B of clip 330 through the bonding agent and drain bond pad 20 of III-N semiconductor chip 10 is bonded to the surface of device receiving region 306 through the bonding agent. A bonding agent is formed on gate lead 307 and a bonding agent is formed on electrically conductive layer 326. Gate bond pad 16 of III-N semiconductor chip 10 is bonded to gate lead 307 through electrically conductive layer 326 and the bonding agent and drain bond pad 20 of III-N semiconductor chip 10 is bonded to the surface of device receiving region 306 through the bonding agent, and source bond pad 18 of III-N semiconductor chip 10 is bonded to source lead 310 through clip 330 and the bonding agent.

Suitable materials for the bonding agent have been described above. Because semiconductor chip 10 is in a flip-chip configuration, gate bond pad 16, source bond pad 18, and drain bond pad 20 are hidden from view in a top view. Accordingly, gate bond pad 16, source bond pad 18, and drain bond pad 20 are shown as rectangular structures formed by broken lines or dashed lines.

As those skilled in the art are aware, support 302A and semiconductor chip 10 may be encapsulated in a protective material such as, for example, a mold compound. After encapsulation, gate lead 307, source lead 310, and drain lead 316 extend from the mold compound. In a through hole package, leads 307, 310, and 316 extend from the mold compound and are substantially coplanar. However, drain lead 316 has a downward bend 316A connecting lead 316 to device region 304. Thus, device receiving regions 304 and 306 and region 308 are below the plane in which leads 307, 310, and 316 are located. In addition, an electrically conductive pedestal extends upward from device receiving region 306 a distance such that it has a surface that is substantially coplanar with the surface of portion 330B of clip 330 so that surface 12 of semiconductor chip 10 is substantially parallel with the surface of the pedestal of device receiving region 306. The pedestal may be a unitary structure formed with support 302A or it may be an electrically conductive material electrically bonded to support 302A. In accordance with an embodiment, the mold compound is a thermally enhanced mold compound. For the sake of clarity, the mold compound is absent from FIG. 22.

FIG. 23 is a top view of a semiconductor component 321 comprising support 302A to which a semiconductor chip 10 is mounted in a flip-chip configuration, wherein support 302A is configured for packaging in a through hole package. Support 302A has been described with reference to FIG. 22. An electrically insulating material is formed on a first portion of region 304 and an electrically insulating material is formed on a second portion of region 304. By way of example, the electrically insulating material on the first portion of region 304 and the electrically insulating material on the second portion of region 304 are ceramic. Although the electrically insulating materials are described as being separate structures, they may be a single unitary structure. A layer of electrically conductive material 324 is formed on the electrically insulating material on the first portion of region 304 and a layer of electrically conductive material 326 is formed on the electrically insulating material on the second portion of region 304. By way of example, electrically conductive layers 324 and 326 are copper.

Semiconductor chip 10 is coupled to or attached to support 302A in a flip-chip configuration, wherein a portion of surface 12 of semiconductor device 10 faces device receiving portion 304. More particularly, a bonding agent is formed on electrically conductive layer 324, a bonding agent is formed on electrically conductive layer 326, and a bonding agent is formed on the surface of device receiving region 306. Source bond pad 18 of III-N semiconductor chip 10 is bonded to electrically conductive layer 324 through the bonding agent, gate bond pad 16 is bonded to electrically conductive layer 326 through the bonding agent, and drain bond pad 20 of III-N semiconductor chip 10 is bonded to the surface of device receiving region 306 through the bonding agent.

A clip 330 having ends 330A and 330B electrically couples electrically conductive layer 324 to source lead 310, where end 330A is bonded to source lead 310 using an electrically conductive bonding agent and end 330B is bonded to electrically conductive layer 324 using and electrically conductive bonding agent. Thus, source bond pad 18 of III-N semiconductor chip 10 is electrically coupled to source lead 310 through electrically conductive layer 324 and clip 330.

A clip 332 having ends 332A and 332B electrically couples electrically conductive layer 326 to gate lead 307, where end 332A is bonded to gate lead 307 using an electrically conductive bonding agent and end 332B is bonded to electrically conductive layer 326 using and electrically conductive bonding agent. Thus, gate bond pad 16 of III-N semiconductor chip 10 is electrically coupled to gate lead 307 through electrically conductive layer 326 and clip 332.

As those skilled in the art are aware, support 302A and semiconductor chip 10 may be encapsulated in a protection material such as, for example, a mold compound. After encapsulation, gate lead 307, source lead 310, and drain lead 316 extend from the mold compound. In a through hole package, leads 307, 310, and 316 extend from the mold compound and are substantially coplanar. However, drain lead 316 has a downward bend 316A connecting lead 316 to device region 304. Thus, device receiving regions 304 and 306 and region 308 are below the plane in which leads 307, 310, and 316 are located. In addition, an electrically conductive pedestal extends upward from device receiving region 306 a distance such that it has a surface that is substantially coplanar with the surface of portion 330B of clip 330 so that surface 12 of semiconductor chip 10 is substantially parallel with the surface of the pedestal of device receiving region 306. The pedestal may be a unitary structure formed with support 302A or it may be an electrically conductive material electrically bonded to support 302A. In accordance with an embodiment, the mold compound is a thermally enhanced mold compound. For the sake of clarity, the mold compound is absent from FIG. 23.

It should be noted that support 302A is illustrated and described as a single element; however, it may be a portion singulated from a leadframe strip and that support 302A conforms with through hole package outlines such as a TO-220 outline, a TO-247 outline, a TO-264 outline, a TO-257 outline, or the like.

Figure 24:
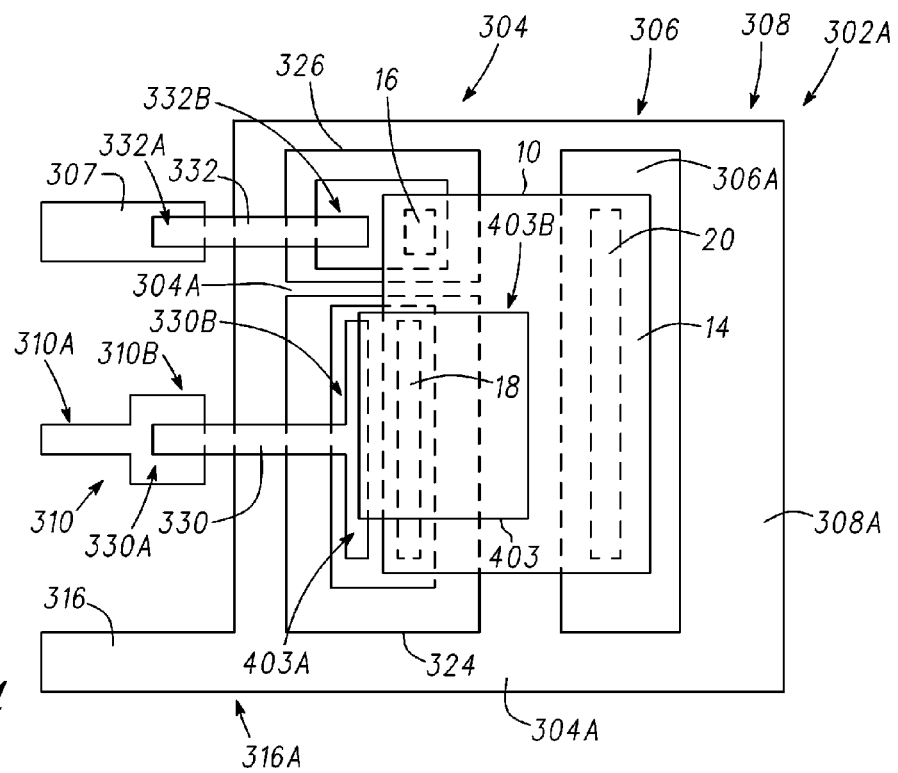
FIG. 24 is a top view of a cascode connected semiconductor component configured for packaging in a through hole package in accordance with another embodiment of the present invention.

FIG. 24 is a top view of a semiconductor component 411 comprising support 302A to which a semiconductor chip 10 is mounted in a flip-chip configuration, wherein support 302A is configured for packaging in a through hole package having, for example, a TO-220 outline, a TO-247 outline, a TO-264 outline, a TO-257 outline, or the like. Support 302A has been described with reference to FIG. 22 and electrically conductive layers 324 and 326 and clips 330 and 332 have been described with reference to FIG. 23. An electrically conductive interconnect 403 electrically connects the substrate or body region of the semiconductor material of semiconductor chip 10 to clip 330, which clip 330 is electrically connected to source lead 310. Connecting the substrate of the semiconductor material of semiconductor chip 10 to source lead 310 enables biasing the semiconductor material, i.e., the substrate, of semiconductor chip 10. Electrically conductive clip 403 has an end 403A electrically connected to clip 330 through a bonding agent and an end 403B electrically connected to the III-nitride semiconductor material of semiconductor chip 10 through a die attach material. For the sake of clarity, the mold compound is absent from FIG. 24.

Figure 25:
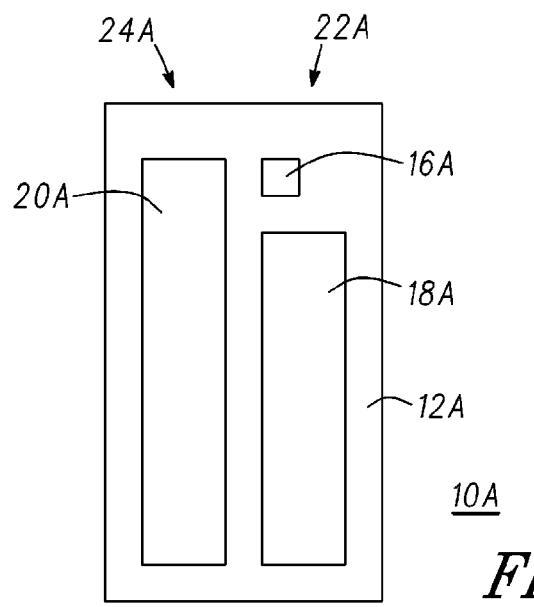
FIG. 25 is a top view of a semiconductor chip suitable for use in manufacturing a semiconductor component in accordance with another embodiment of the present invention.

FIG. 25 is a top view of a semiconductor chip 10A suitable for use in manufacturing a semiconductor component in accordance with another embodiment of the present invention. Semiconductor chip 10A has a top surface 12A and a bottom surface 14A (shown in FIGS. 27 and 28), wherein a gate bond pad 16A is formed on or from a portion of top surface 12A, a source bond pad 18A is formed on or from another portion of top surface 12, and a drain bond pad 20A formed on or from another portion of top surface 12A. Gate bond pad 16A and source bond pad 18A are formed on a side 22A of semiconductor chip 10A and drain bond pad 20A is formed on a side 24A of semiconductor chip 10A. Sides 22A and 24A are on opposite sides of semiconductor chip 10A. Semiconductor chip 10A is fabricated from a compound semiconductor material such as, for example, a III-nitride semiconductor material. Thus, semiconductor chip 10A may be referred to as a III-nitride semiconductor chip, i.e., the substrate material of III-nitride semiconductor chip 10A comprises a III-nitride material such as, for example, aluminum nitride. A III-nitride semiconductor material may be referred to as a III-N semiconductor material, a III-nitride based semiconductor material, a III-N based semiconductor material, or the like. This material may be referred to as a body of semiconductor material. A semiconductor chip such as, for example, semiconductor chip 10A, may be referred to as a semiconductor die. It should be noted that source bond pad 18A and drain bond pad 20A are formed over active areas. Thus, reference character "A" has been appended to the reference characters of FIG. 25, i.e., the reference characters of semiconductor device 10A are distinguished from those of semiconductor device 10 by appending reference character "A" to the reference characters of FIG. 25.

Figure 26:
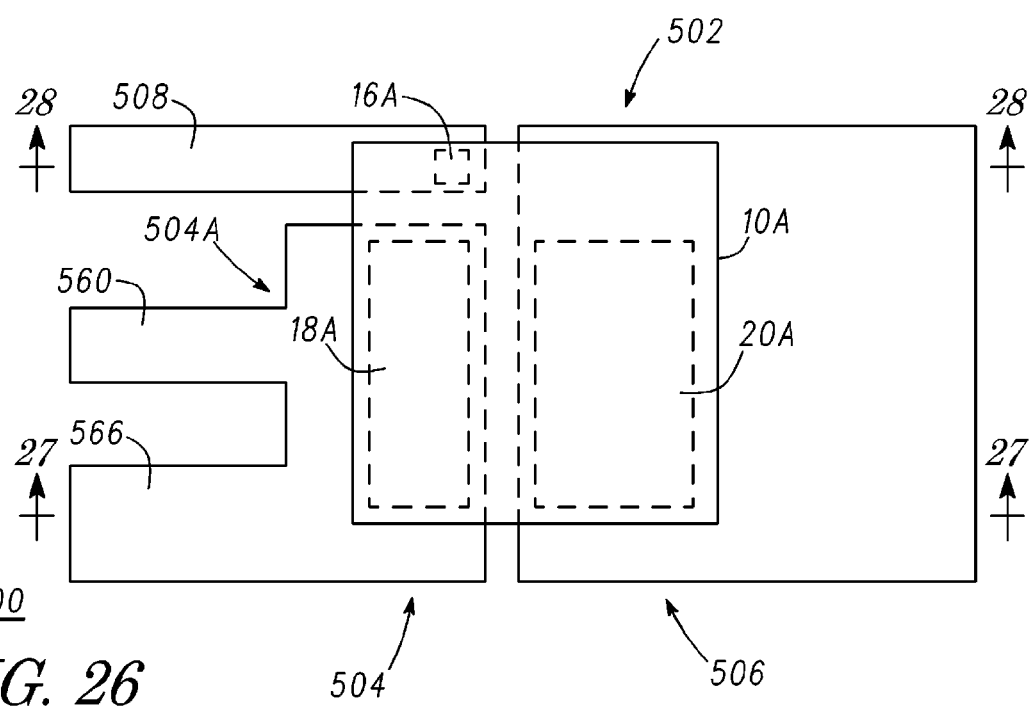
FIG. 26 is a top view of a cascode connected semiconductor component configured for packaging in a QFN package in accordance with another embodiment of the present invention.
Figure 27:
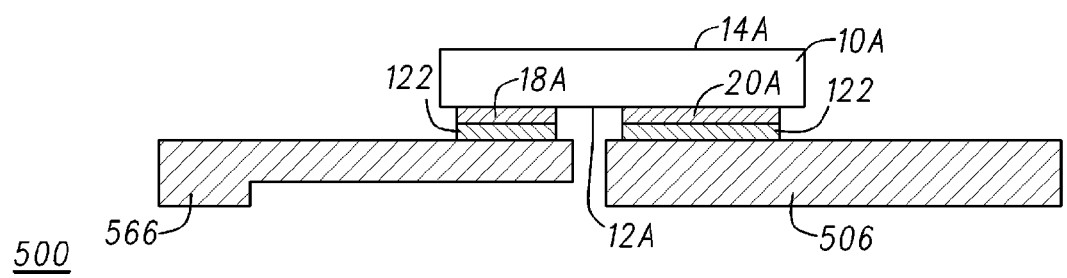
FIG. 27 is a cross-sectional view of the semiconductor component of FIG. 26 taken along section line 27-27 of FIG. 26.
Figure 28:
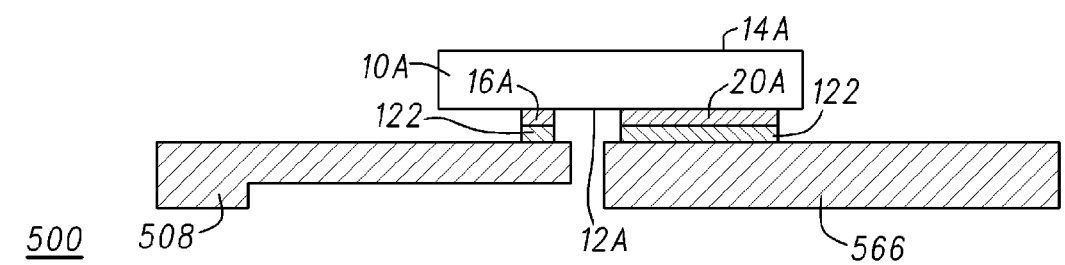
FIG. 28 is a cross-sectional view of the semiconductor component of FIG. 26 taken along section line 28-28 of FIG. 26.

FIG. 26 is a top view of a semiconductor component 500 comprising a support 502 to which a semiconductor chip 10A is mounted in a flip-chip configuration, wherein support 502 is configured for packaging in a QFN package. FIG. 27 is a cross-sectional view of semiconductor component 500 taken along section line 27-27 of FIG. 26 and FIG. 28 is a cross-sectional view of semiconductor component 500 taken along section line 28-28 of FIG. 26. For the sake of clarity, FIGS. 26-28 are described together. More particularly, support 502 may be manufactured from an electrically conductive material such as, for example, copper. Support 502 includes device receiving portions 504 and 506, wherein a portion of semiconductor chip 10A, i.e., source bond pad 18A on side 22A of semiconductor chip 10A, is electrically connected to device receiving portion 504 and a portion of semiconductor chip 10A, i.e., a drain bond pad 20A on side 24A of semiconductor chip 10A, is electrically connected to device receiving portion 506. Device receiving portion 504 is an electrically conductive "F" shaped structure having a rectangularly shaped body 504A from which a source lead 566 extends and a Kelvin lead 560 extends. In accordance with an embodiment, Kelvin lead 560 extends from a central region of rectangularly shaped body 504A and source lead 566 extends from an end region of rectangularly shaped body 504A. It should be noted that source lead 566 is shown as being wider than Kelvin lead 560, however this is not a limitation of the present invention. For example, source lead 566 and Kelvin lead 560 can have the same width as source lead 566 or Kelvin lead 560 can be wider than source lead 566.

Device receiving portion 506 may be a square shaped electrically conductive structure. In accordance with an embodiment, device receiving portion 506 may have a square shape when viewed from a top view. Alternatively, device receiving portion 506 may have a rectangular shape when viewed from a top view or a polygonal shaped when viewed from a top view, or a circular shape when viewed from a top view, or an elliptical shape when viewed from a top view, or the like.

Device receiving portions 504 and 506 may be referred to as mating portions.

Support 502 is further configured to have a rectangularly shaped electrically conductive structure 508 adjacent to but electrically isolated from device receiving portion 504 and device receiving portion 506. In accordance with an embodiment, rectangularly shaped electrically conductive structure 508 serves as a gate lead. Like device receiving portion 506, electrically conductive structure 508 may have a rectangular shape when viewed from a top view or a polygonal shaped when viewed from a top view, or a circular shape when viewed from a top view, or an elliptical shape when viewed from a top view, or the like. The shape of device receiving portions 504 and 506 including leads 508, 560, and 566 are not limitations of the present invention.

Semiconductor device 10A is coupled to or attached to support 502 in a flip-chip configuration, wherein a portion of surface 12A of semiconductor device 10A faces device receiving portion 504 and a portion of surface 12A faces device receiving portion 506. More particularly, a bonding agent 122 such as, for example solder is formed on source lead 566 and a bonding agent 122 is formed on a portion of device support structure 566. Source bond pad 18A of III-N semiconductor chip 10A is bonded to source lead 566 through bonding agent 122 and drain bond pad 20A of III-N semiconductor chip 10A is bonded to device receiving portion 506 through bonding agent 122 as shown in FIG. 27. Suitable materials for bonding agent 122 have been described above. Gate bond pad 16A is bonded to gate lead 508 using bonding agent 122 as shown in FIG. 28. Because semiconductor chip 10A is in a flip-chip configuration, gate bond pad 16A, source bond pad 18A, and drain bond pad 20A are hidden from view in a top view. Accordingly, gate bond pad 16A, source bond pad 18A, and drain bond pad 20A are shown as rectangular structures formed by broken lines or dashed lines in FIG. 29.

As those skilled in the art are aware, support 502, including device receiving portions 504 and 506 and semiconductor chip 10A, may be encapsulated in a protective material such as, for example a mold compound. It should be noted that after encapsulation, gate lead 508, Kelvin lead 560, source lead 566, and drain lead 568 extend from the mold compound. In accordance with an embodiment, the mold compound is a thermally enhanced mold compound. For the sake of clarity, the mold compound is absent from FIGS. 26-28.

Figure 29:
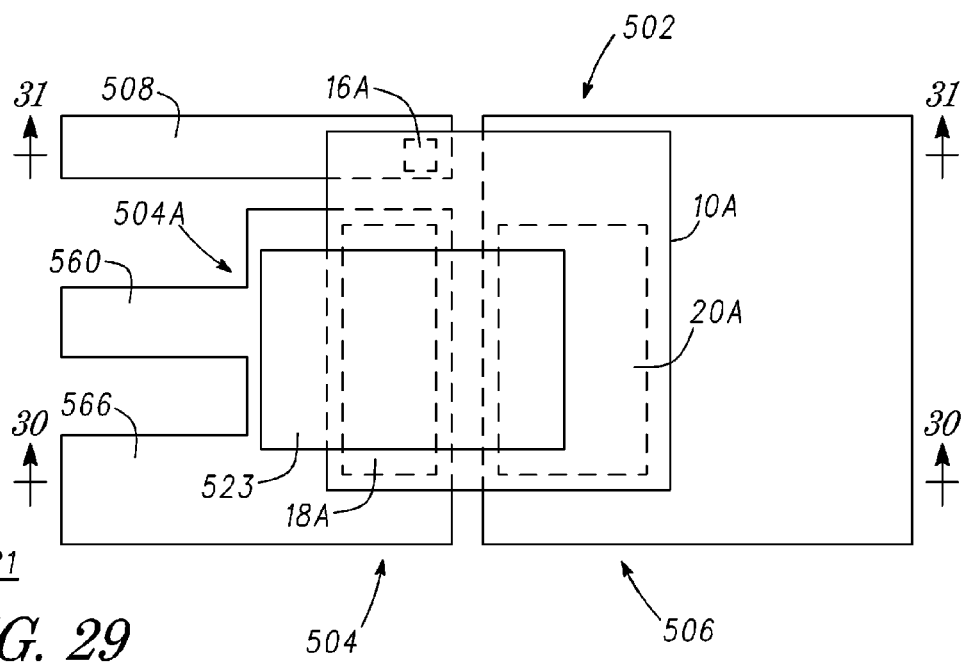
FIG. 29 is a top view of a cascode connected semiconductor component configured for packaging in a QFN package in accordance with another embodiment of the present invention.
Figure 30:
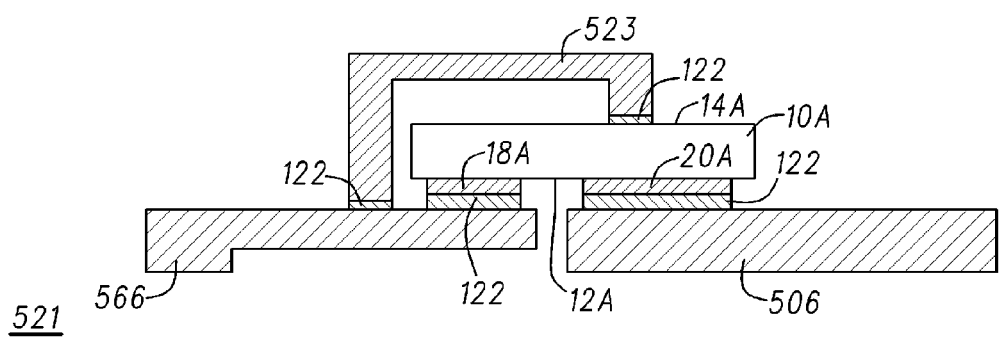
FIG. 30 is a cross-sectional view of the semiconductor component of FIG. 29 taken along section line 30-30 of FIG. 29.
Figure 31:
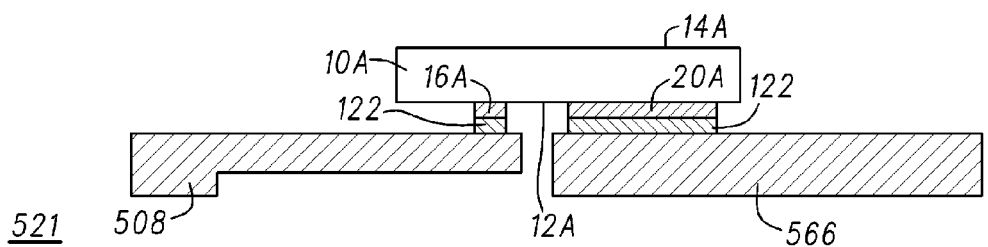
FIG. 31 is a cross-sectional view of the semiconductor component of FIG. 29 taken along section line 31-31 of FIG. 29.

FIG. 29 is a top view of a semiconductor component 521 comprising support 502 to which semiconductor chip 10A is mounted in a flip-chip configuration, wherein support 502 is configured for packaging in a QFN package. FIG. 30 is a cross-sectional view of semiconductor component 521 taken along section line 30-30 of FIG. 29 and FIG. 31 is a cross-sectional view of semiconductor component 521 taken along section line 31-31 of FIG. 29. For the sake of clarity, FIGS. 29-31 are described together. Support structure 502 and mounting semiconductor chip 10A to support structure 521 have been described with reference to FIGS. 26-28.

Thus, semiconductor component 521 is the same as semiconductor component 500 with the addition of an electrically conductive interconnect 523 that electrically connects the substrate or body region of semiconductor chip 10A to device receiving portion 504. By way of example, electrically conductive interconnect 523 is a clip having an end connected to or bonded to the substrate of semiconductor chip 10A and another end electrically connected to or bonded to source lead 566 and to Kelvin lead 560. Thus, electrically conductive clip 523 electrically connects the substrate of semiconductor chip 10A to the source of semiconductor chip 10A so that the substrate and source of semiconductor chip 10A are at the same potential, e.g., they may be electrically shorted together.

As those skilled in the art are aware, support 502, including device receiving portions 504 and 506, semiconductor chip 10A, and clip 523 may be encapsulated in a protection material such as, for example a mold compound. In a QFN package, leads 508, 560, and 566 extend from the mold compound and are substantially coplanar where device receiving portion 506 serves as the drain of semiconductor component 521. Thus, a surface of device receiving portion 506 at a back side of the QFN package is exposed to facilitate electrically contacting the drain of semiconductor component 521. In accordance with an embodiment, the mold compound is a thermally enhanced mold compound. For the sake of clarity, the mold compound is absent from FIGS. 29-31.

It should be noted that after encapsulation, gate lead 508, Kelvin lead 560, and source lead 566 extend from the mold compound. In accordance with an embodiment, the mold compound is a thermally enhanced mold compound. For the sake of clarity, the mold compound is absent from FIGS. 29-31.

In a QFN package, leads 307 and 310 extend from the mold compound and are substantially coplanar where device receiving portion 306 and region 308 serve as the drain of semiconductor component 521. Thus, a surface of device receiving portion 306 and region 308 at a back side of the QFN package is exposed to facilitate electrically contacting the drain of semiconductor component 521. In accordance with an embodiment, the mold compound is a thermally enhanced mold compound. For the sake of clarity, the mold compound is absent from FIGS. 29-31.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A semiconductor component having at least first and second terminals, comprising:
    a support having first and second device receiving portions, a first lead extending from the first device receiving portion and a second lead extending from the first die receiving portion, wherein the first and second leads are integral with the first device receiving portion;
    a third lead adjacent to and electrically isolated from the first and second device receiving portions; and
    a first semiconductor device having a first surface and a second surface, wherein a first bond pad extends from a first portion of the first surface, a second bond pad extends from a second portion of the first surface and a third bond pad extends from a third portion of the first surface, the first semiconductor device mounted to the support in a flip chip configuration, wherein the first bond pad is coupled to the first device receiving portion, the second bond pad is coupled to the second device receiving portion, and the third bond pad is coupled to the third lead, wherein the first semiconductor device is configured from a III-N semiconductor material.

2. The semiconductor component of claim 1, wherein the semiconductor device is a first field effect transistor having a control electrode and first and second current carrying electrodes, the third bond pad serving as the control electrode of the field effect transistor, the first bond pad serving as first current carrying electrode of the field effect transistor, and the second bond pad serving as the second current carrying electrode of the field effect transistor.

3. The semiconductor component of claim 2, wherein the first bond pad is a source bond pad, the second bond pad is a drain bond pad, and the third bond pad is a gate bond pad.

4. The semiconductor component of claim 2, wherein the first bond pad is coupled to the first device receiving portion through a first solder layer, the second bond pad is coupled to the second device receiving portion through a second solder layer, and the third bond pad is coupled to the third lead through a third solder layer.

5. The semiconductor component of claim 1, further including an electrically conductive interconnect having a first terminal and a second terminal, the first terminal of the electrically conductive interconnect coupled to the first device receiving portion and the second terminal of the electrically conductive interconnect coupled to the second surface of the first semiconductor device.

6. The semiconductor component of claim 1, further including a fourth lead wherein the fourth lead is integral with and extends from the second device receiving portion.

7. The semiconductor component of claim 1, wherein the first semiconductor device includes a semiconductor material having an active area and a passive area, and wherein the first bond pad and the second bond pad are over the passive area.

8. The semiconductor component of claim 1, wherein the first semiconductor device includes a semiconductor material having an active area and a passive area, and wherein the first bond pad and the second bond pad are over the active area.

9. A semiconductor component having at least first and second terminals, comprising:
    a support having a first region, a second region, and a third region, wherein the first region is separated from the third region by the second region, wherein the second region is comprised of a pedestal;
    a first lead adjacent to and electrically isolated from the first region;
    a second lead adjacent to and electrically isolated from the first region; and
    a first semiconductor device having a first surface and a second surface, wherein a first bond pad extends from a first portion of the first surface, a second bond pad extends from a second portion of the first surface and a third bond pad extends from a third portion of the first surface, the first semiconductor device mounted to the support in a flip chip configuration, wherein the first bond pad is coupled to a first portion of the first region, the drain bond pad is coupled to the pedestal of the second region, and the third bond pad is coupled to a second portion of the first region, and wherein the first semiconductor device is configured from a III-N semiconductor material.

10. The semiconductor component of claim 9, further including:
a first electrically insulating material formed on the first portion of the first region and a second electrically insulating material formed on the second portion of the first region, the first portion of the first region spaced apart from the second portion of the first region; and
a first layer of electrically conductive material formed on the first electrically insulating material and a second layer of electrically conductive material formed on the second electrically insulating material.

11. The semiconductor component of claim 10, wherein the first bond pad is coupled to the first layer of electrically conductive material and the third bond pad is coupled to the second layer of electrically conductive material.

12. The semiconductor component of claim 11, further including:
a first clip having a first end and a second end, the first end of the first clip coupled to the first lead and the second end of the first clip coupled to the second layer of electrically conductive material; and
a second clip having a first end and a second end, the first end of the second clip coupled to the second lead and the second end of the second clip coupled to the first layer of electrically conductive material.

13. The semiconductor component of claim 12, wherein the first semiconductor device is bonded to the first clip and to the second clip by a bonding agent, wherein the second clip is between a first portion of the first semiconductor device and the first electrically conductive material and the first clip is between a second portion of the first semiconductor device and the second electrically conductive material.

14. The semiconductor component of claim 12, wherein the first semiconductor device is bonded to the first electrically conductive material and to the second electrically conductive material by a bonding agent, wherein the first semiconductor device is laterally adjacent the second clip.

15. The semiconductor component of claim 12, further including a third clip having a first end and a second end, the first end of the third clip coupled to the second clip and the second end of the third clip coupled to the first semiconductor device.

16. The semiconductor component of claim 10, further including a third lead extending from the first region, the third lead integrally formed with the first region.

17. The semiconductor component of claim 16, further including:
a first clip having a first end and a second end, the first end of the first clip coupled to the first lead and the second end of the first clip coupled to the second layer of electrically conductive material; and
a second clip having a first end and a second end, the first end of the second clip coupled to the second lead and the second end of the second clip coupled to the first layer of electrically conductive material, wherein the first semiconductor device is bonded to the first electrically conductive material and to the second electrically conductive material by a bonding agent, wherein the first semiconductor device is laterally adjacent the second clip; and
a third clip having a first end and a second end, the first end of the third clip coupled to the second clip and the second end of the third clip coupled to the first semiconductor device.

* * * * *